US010593375B2

(12) United States Patent
Ishii

(10) Patent No.: US 10,593,375 B2
(45) Date of Patent: Mar. 17, 2020

(54) SEMICONDUCTOR MEMORY DEVICE WITH CORRECTING RESISTANCES IN SERIES WITH MEMORY ARRAY SIGNAL LINES

(71) Applicant: TOSHIBA MEMORY CORPORATION, Minato-ku, Tokyo (JP)

(72) Inventor: Kazuyo Ishii, Kamakura Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/914,687

(22) Filed: Mar. 7, 2018

(65) Prior Publication Data

US 2019/0088289 A1    Mar. 21, 2019

(30) Foreign Application Priority Data

Sep. 15, 2017 (JP) .................... 2017-177464

(51) Int. Cl.
| G11C 5/06 | (2006.01) |
| G11C 11/16 | (2006.01) |
| G11C 13/00 | (2006.01) |
| G11C 7/18 | (2006.01) |
| G11C 8/10 | (2006.01) |

(52) U.S. Cl.
CPC .......... *G11C 5/063* (2013.01); *G11C 11/1653* (2013.01); *G11C 11/1655* (2013.01); *G11C 11/1657* (2013.01); *G11C 11/1659* (2013.01); *G11C 11/1673* (2013.01); *G11C 13/003* (2013.01); *G11C 13/004* (2013.01); *G11C 13/0023* (2013.01); *G11C 13/0026* (2013.01); *G11C 13/0028* (2013.01); *G11C 13/0069* (2013.01); *G11C 7/18* (2013.01); *G11C 8/10* (2013.01)

(58) Field of Classification Search
None
See application file for complete search history.

(56) References Cited

U.S. PATENT DOCUMENTS

| 5,444,663 | A * | 8/1995 | Furuno .................. G11C 5/143 365/189.09 |
| 6,480,438 | B1 * | 11/2002 | Park ...................... G11C 16/08 365/100 |
| 9,679,643 | B1 * | 6/2017 | Chou .................... G11C 13/004 |
| 2005/0127978 | A1 * | 6/2005 | Cranford, Jr. .......... H01C 17/22 327/334 |
| 2007/0159870 | A1 | 7/2007 | Tanizaki et al. |
| 2010/0128512 | A1 | 5/2010 | Ohnishi et al. |

(Continued)

FOREIGN PATENT DOCUMENTS

| JP | 2007129041 A | 5/2007 |
| JP | 2011066363 A | 3/2011 |

(Continued)

*Primary Examiner* — J. H. Hur
(74) *Attorney, Agent, or Firm* — Holtz, Holtz & Volek PC

(57) ABSTRACT

According to one embodiment, a semiconductor storage device comprises a first memory cell including a first resistance change element; a first bit line and a first source line coupled to the first memory cell; and a first resistance coupled to at least one of the first bit line and the first source line.

13 Claims, 17 Drawing Sheets

(56) References Cited

U.S. PATENT DOCUMENTS

| | | | |
|---|---|---|---|
| 2010/0271867 A1* | 10/2010 | Lee | G11C 8/08 |
| | | | 365/163 |
| 2011/0069530 A1 | 3/2011 | Sekine et al. | |
| 2011/0280097 A1* | 11/2011 | Bolandrina | G11C 8/08 |
| | | | 365/230.06 |
| 2012/0314478 A1 | 12/2012 | Ha et al. | |
| 2014/0098592 A1* | 4/2014 | Lee | G11C 13/004 |
| | | | 365/145 |
| 2015/0255717 A1 | 9/2015 | Park et al. | |
| 2015/0262701 A1 | 9/2015 | Takizawa | |
| 2017/0062035 A1 | 3/2017 | Antonyan | |

FOREIGN PATENT DOCUMENTS

| | | | |
|---|---|---|---|
| JP | 2012253129 A | 12/2012 |
| TW | 200802364 A | 1/2008 |
| TW | 201606768 A | 2/2016 |
| TW | 201711038 A | 3/2017 |

* cited by examiner

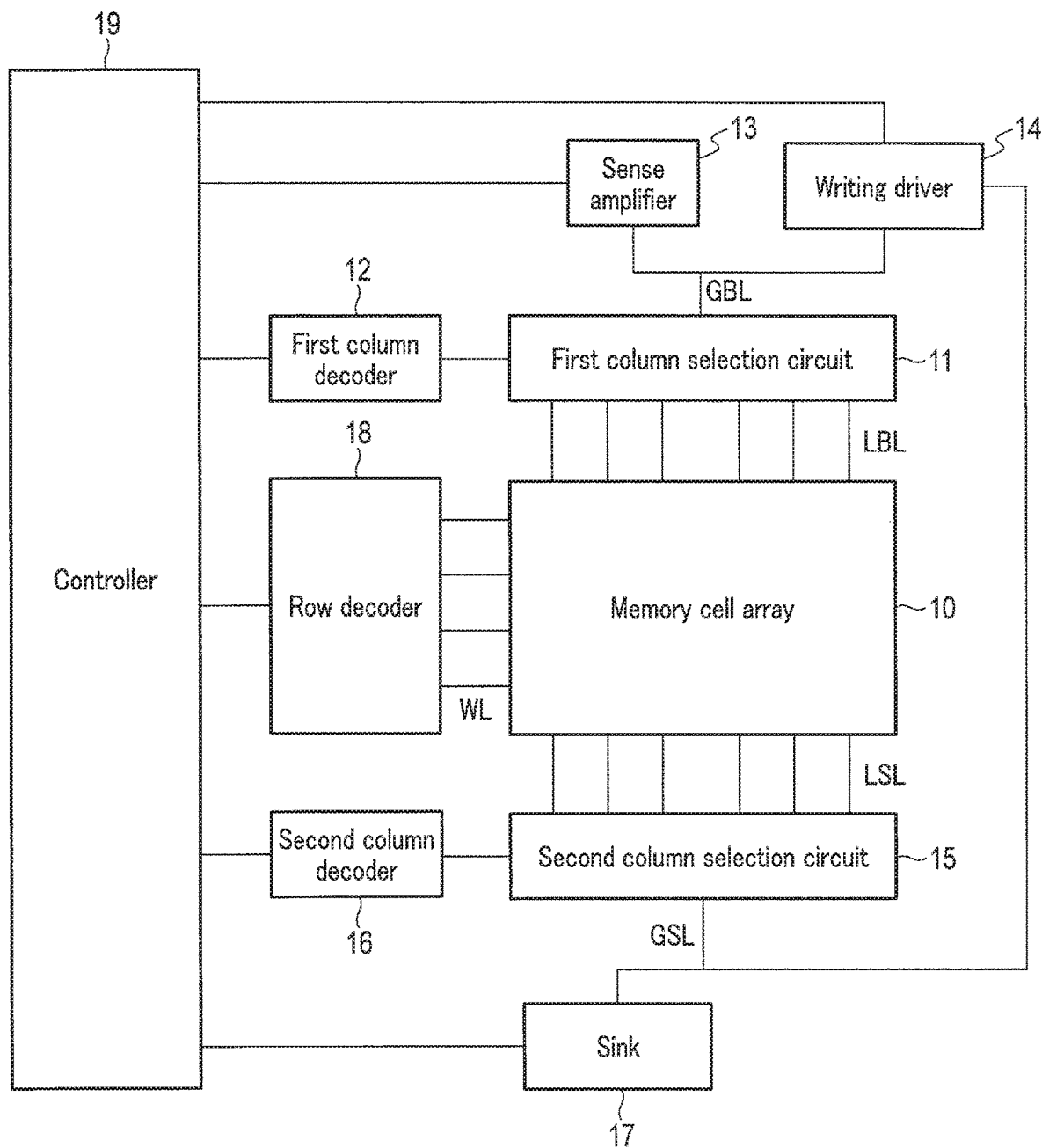
F I G. 1

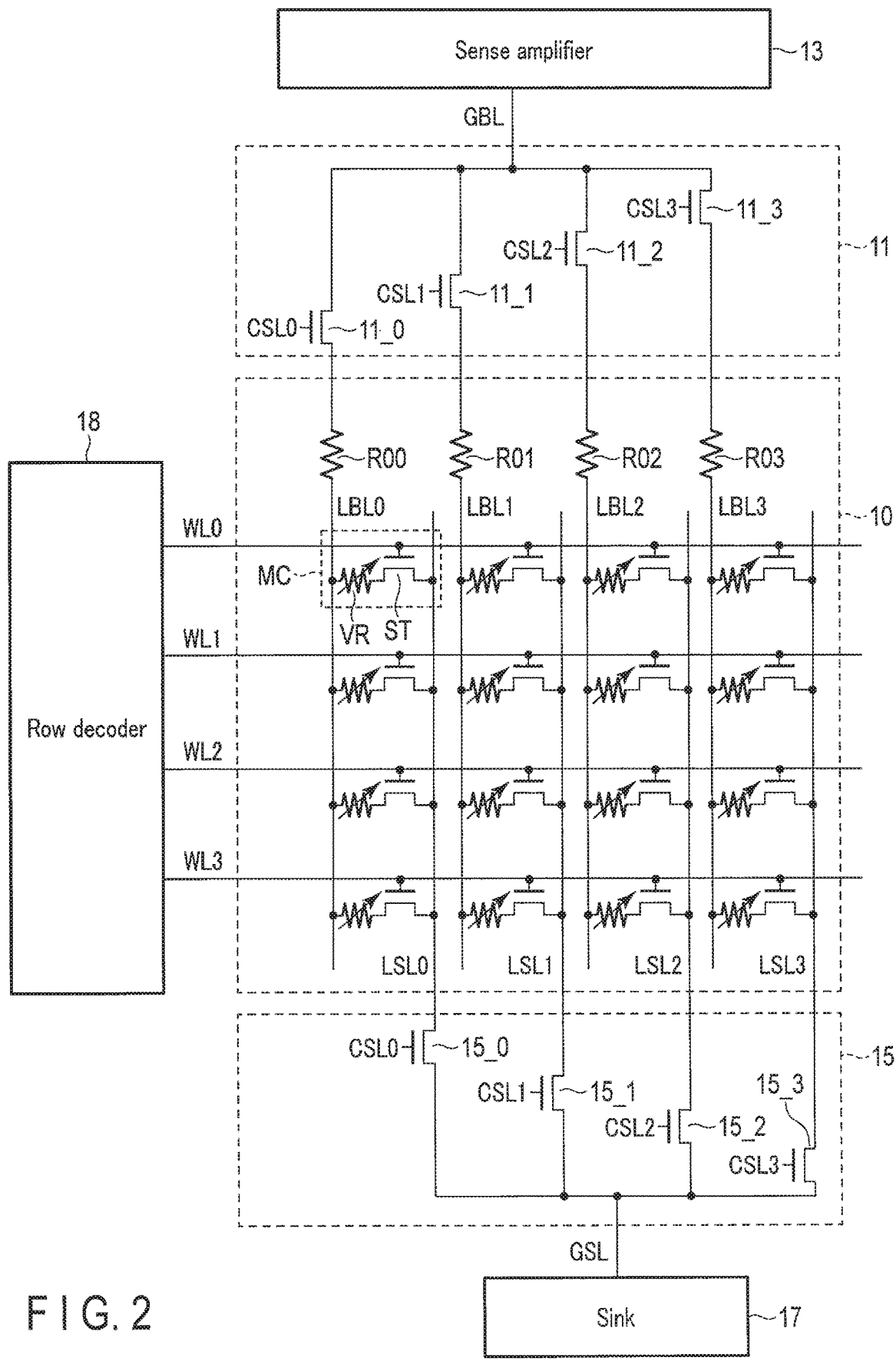
F I G. 2

Write current
Parallel state (low resistance)

Write current

Anti-parallel state (high resistance)

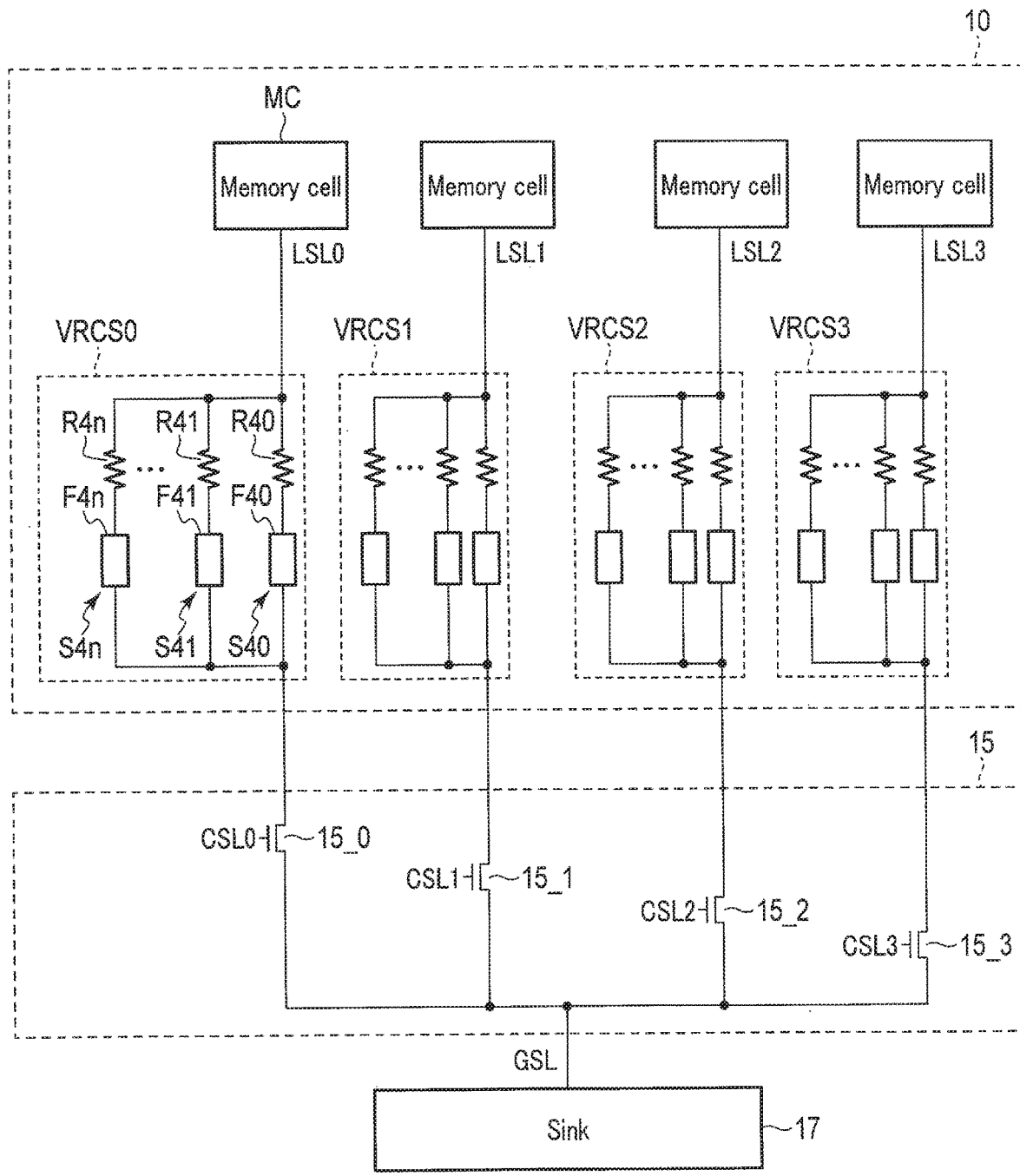
F I G. 13

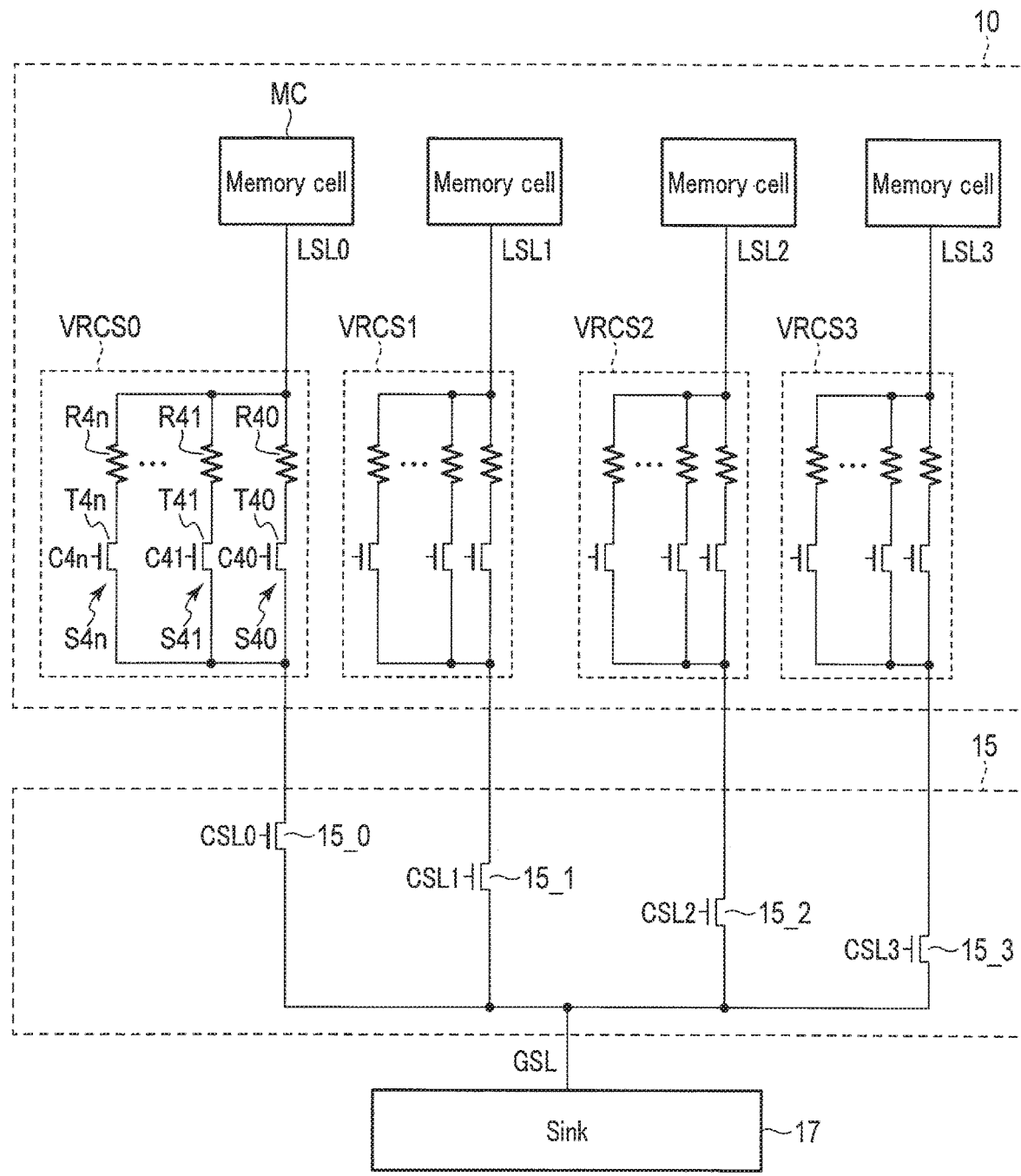
F I G. 14

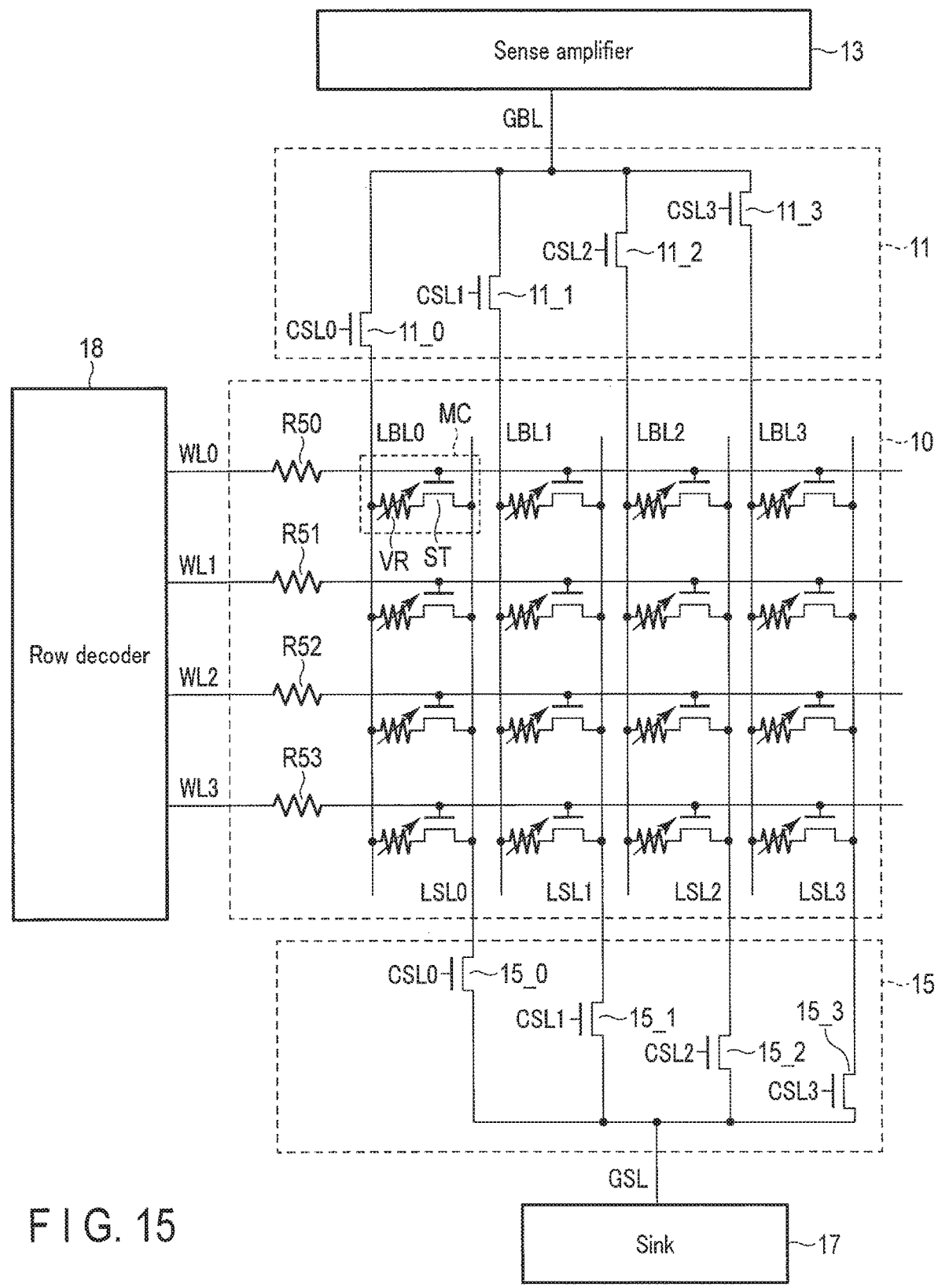
F I G. 15

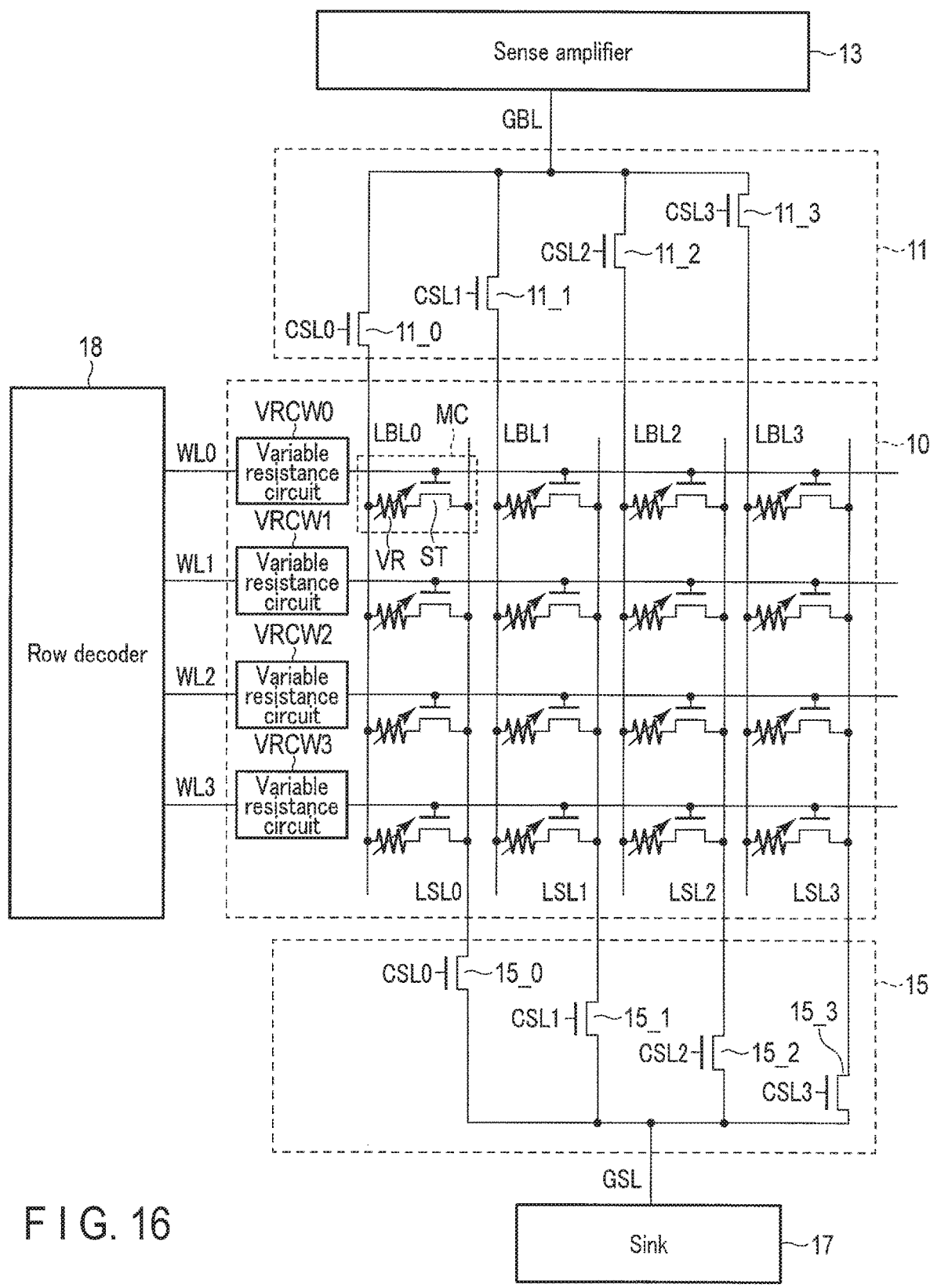
F I G. 16

SEMICONDUCTOR MEMORY DEVICE WITH CORRECTING RESISTANCES IN SERIES WITH MEMORY ARRAY SIGNAL LINES

CROSS-REFERENCE TO RELATED APPLICATION

This application is based upon and claims the benefit of priority from the prior Japanese Patent Application No. 2017-177464, filed Sep. 15, 2017, the entire contents of which are incorporated herein by reference.

FIELD

Embodiment relate to a semiconductor storage device.

BACKGROUND

Magnetic Random Access Memory (MRAM) is a memory device that uses a storage element having a magnetoresistance effect achieved with a memory cell that stores information. MRAM is attracting attention as a next generation memory device characterized in high speed operation, large capacity, and nonvolatility.

BRIEF DESCRIPTION OF THE DRAWINGS

FIG. 1 is a block figure showing a semiconductor storage device according to a first embodiment;

FIG. 2 is a circuit diagram showing a memory cell array, a first column selection circuit, and a second column selection circuit in the semiconductor storage device according to the first embodiment in more detail;

FIG. 13 is a circuit diagram showing variable resistance circuits in the semiconductor storage device according to the fifth embodiment in more detail;

FIG. 14 is a circuit diagram showing variable resistance circuits in the semiconductor storage device according to a sixth embodiment in more detail;

FIG. 15 is a circuit diagram showing a memory cell array, a first column selection circuit, and a second column selection circuit in the semiconductor storage device according to a seventh embodiment in more detail;

FIG. 16 is a circuit diagram showing a memory cell array, a first column selection circuit, and a second column selection circuit in the semiconductor storage device according to an eighth embodiment in more detail;

DETAILED DESCRIPTION

Figure 3A:
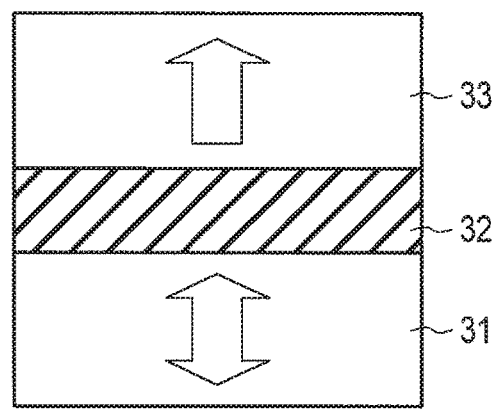
FIG. 3A is a cross-sectional view showing a resistance change element in the semiconductor storage device according to the first embodiment.

In general, according to one embodiment, a semiconductor storage device includes a first memory cell including a first resistance change element; a first bit line and a first source line coupled to the first memory cell; and a first resistance coupled to at least one of the first bit line and the first source line.

Embodiments will be described below with reference to the drawings. In the drawings, the same reference numerals are attached to the same portions.

First Embodiment

A semiconductor storage device according to the first embodiment will be described below with reference to FIGS. 1 to 5. In the following, an MRAM that stores data using a magnetoresistance effect element (Magnetic Tunnel Junction (MTJ) element) as a resistance change element will be described as an example, but the embodiment is not limited thereto. The present embodiment is applicable to a memory in general that performs sensing by converting the resistance difference of a resistance change element into a current difference or a voltage difference, regardless of whether it is a volatile memory or a nonvolatile memory. The present embodiment can also be applied to a semiconductor storage device having an element for storing data using a resistance change like a resistance change memory similar to MRAM, such as, for example, ReRAM, PCRAM, and the like.

In the following description, unless specifically limited, "couple" includes not only direct couple but also couple via an arbitrary element. That is, "couple" includes electrical couple. The first terminal of the transistor indicates one of the source and the drain, and the second terminal of the transistor indicates the other of the source or the drain. The control terminal of the transistor indicates the gate.

Configuration Example of First Embodiment

FIG. 1 is a block figure showing a semiconductor storage device (MRAM) according to the first embodiment.

As shown in FIG. 1, the semiconductor storage device includes a memory cell array 10, a first column selection circuit 11, a first column decoder 12, a sense amplifier 13, a writing driver 14, a second column selection circuit 15, a second column decoder 16, a sink 17, a row decoder 18, and a controller 19.

The controller 19 controls the entire semiconductor storage device in response to an external control signal from the outside (host device). More specifically, the controller 19 receives, for example, commands, addresses, data, and the like, as an external control signal. Then, the controller 19 generates an internal control signal according to the external control signal, and sends an internal control signal to various elements.

The memory cell array 10 includes a plurality of memory cells MC for storing data. Each memory cell MC is provided at the intersection between the word line WL and the local bit line LBL/the local source line LSL. Therefore, the plurality of memory cells MC are arranged in a matrix.

The first column decoder 12 decodes an address from the controller 19 and supplies (applies) a voltage to the column selection control line CSL (CSL0-CSL3) of the selected first column selection circuit 11.

The first column selection circuit 11 selectively couples the local bit line LBL and the global bit line GBL according to the voltage supplied from the first column decoder 12.

The sense amplifier 13 is electrically coupled to the global bit line GBL. The sense amplifier 13 reads the data of the memory cell MC by detecting the read current or the read voltage in reading.

The writing driver 14 is electrically coupled to the global bit line GBL and the global source line GSL. In the writing operation, the writing driver 14 applies a writing voltage to the global bit line GBL or the global source line GSL. As a result, a writing current flows from the global bit line GBL to the global source line GSL via the memory cell MC, or a writing current flows from the global source line GSL to the global bit line GBL via the memory cell MC.

The second column decoder 16 decodes the address from the controller 19 and supplies the voltage to the column selection control line CSL (CSL0-CSL3) of the selected second column selection circuit 15.

The second column selection circuit 15 selectively couples the local source line LSL and the global source line GSL according to the voltage supplied from the second column decoder 16.

The sink 17 is electrically coupled to the global source line GSL. The sink 17 is, for example, a ground voltage. A read current flows into the sink 17 in reading.

The row decoder 18 decodes the address from the controller 19 and supplies the voltage to the selected word line WL.

FIG. 2 is a circuit diagram showing the memory cell array 10, the first column selection circuit 11, and the second column selection circuit 15 in the semiconductor storage device according to the first embodiment in more detail.

As shown in FIG. 2, the local bit line LBL (LBL0-LBL3), the local source line LSL (LSL0-LSL3), and the word line WL (WL0-WL3) are provided in the memory cell array 10. The local bit line LBL and the local source line LSL extend in the first direction. The local bit lines LBL and the local source lines LSL are provided alternately in the second direction crossing the first direction. The word line WL extends in the second direction. The memory cell array 10 has a plurality of memory cells MC. Each memory cell MC is provided at the intersection between the local bit line LBL/the local source line LSL and the word line WL. Therefore, the plurality of memory cells MC are arranged in a matrix form in the first direction and the second direction.

The numbers of the local bit lines LBL, the local source lines LSL, and the word lines WL are examples, and are not particularly limited.

The memory cell MC includes, for example, a resistance change element VR and a selection transistor ST. The first terminal of the resistance change element VR is electrically coupled to the local bit line LBL, and the second terminal is electrically coupled to the first terminal of the selection transistor ST. The second terminal of the selection transistor ST is electrically coupled to the local source line LSL, and the control terminal of the selection transistor ST is electrically coupled to the word line WL.

The resistance change element VR is an element whose resistance value changes by applying current (or voltage). The resistance change element VR includes, for example, an MTJ element, a phase change element, a ferroelectric element, and the like. The memory cell MC is selected when the selection transistor ST is turned on by the word line WL. In the following description, an MRAM, i.e., a case where the resistance change element VR is an MTJ element, will be described.

FIG. 3A is a cross-sectional view showing the resistance change element VR in the semiconductor storage device according to the first embodiment. Here, the storage layer 31, the tunnel barrier layer 32, and the reference layer 33 are mainly shown as the resistance change element VR.

As shown in FIG. 3A, the resistance change element VR includes a laminate body including a storage layer 31 which is a ferromagnetic layer, a reference layer 33 which is a ferromagnetic layer, and a tunnel barrier layer 32 which is a nonmagnetic layer formed therebetween.

The storage layer 31 is a ferromagnetic layer having a variable magnetization direction, and has a perpendicular magnetic anisotropy that is perpendicular or substantially perpendicular to the film surface (upper/lower surface). Here, the magnetization direction is variable, indicating that the magnetization direction changes with respect to a predetermined writing current. In addition, substantially vertical means that the direction of remanent magnetization is within the range of 45 degrees<θ≤90 degrees with respect to the film surface. The storage layer 31 includes, for example, cobalt iron boron (CoFeB) or iron boride (FeB).

The tunnel barrier layer 32 is formed on the storage layer 31. The tunnel barrier layer 32 is a nonmagnetic layer, and includes, for example, MgO.

The reference layer 33 is formed on the tunnel barrier layer 32. The reference layer 33 is a ferromagnetic layer in which the direction of magnetization is invariant and has perpendicular magnetic anisotropy that is perpendicular or substantially perpendicular to the film surface. Here, the magnetization direction being invariable means that the magnetization direction does not change with respect to a predetermined writing current. More specifically, the inversion energy barrier of the magnetization direction of the reference layer 33 is larger than that of the storage layer 31. The reference layer 33 includes, for example, cobalt platinum (CoPt), cobalt nickel (CoNi), or cobalt palladium (CoPd).

FIG. 33 is a figure for explaining the writing of the resistance change element VR in the semiconductor storage device according to the first embodiment, and is a figure showing a sectional view of the resistance change element VR in the parallel state (P state). FIG. 3C is a figure for explaining the writing of the resistance change element VR in the semiconductor storage device according to the first embodiment, and is a figure showing a sectional view of the resistance change element VR in the antiparallel state (AP state).

The resistance change element VR is, for example, a spin transfer type resistance change element. Therefore, when data is written to the resistance change element VR or data is read from resistance change element VR, the resistance change element VR flows bi-directionally in a direction perpendicular to the film surface.

More specifically, writing data to the resistance change element VR is performed as follows.

Figure 3B:
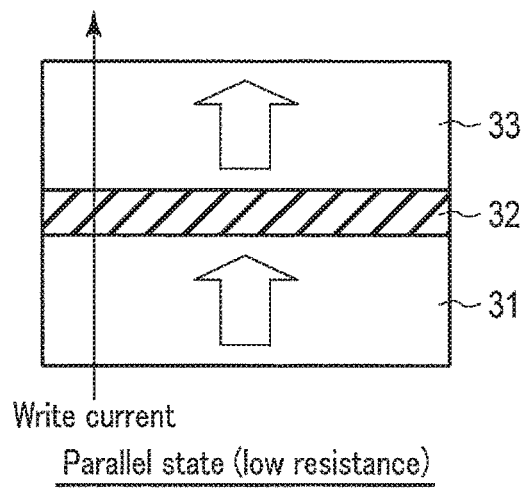
FIG. 3B is a figure for explaining writing of the resistance change element in the semiconductor storage device according to the first embodiment, and showing a sectional view of the resistance change element in the parallel state (P state)
Figure 3C:
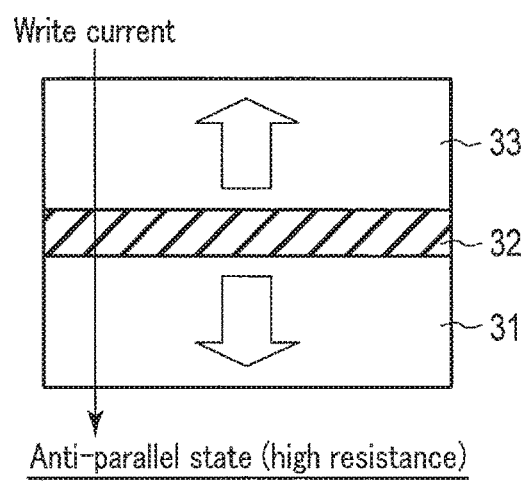
FIG. 3C is a figure for explaining the writing of the resistance change element in the semiconductor storage device according to the first embodiment, and showing a cross-sectional view of the resistance change element in an antiparallel state (AP state)

As shown in FIG. 3B, when a current flows from the storage layer 31 the reference layer 33, i.e., when electrons are supplied from the reference layer 33 to the storage layer 31, electrons spin-polarized in the same direction as the magnetization direction of the reference layer 33 are injected into the storage layer 31. In this case, the magnetization direction of the storage layer 31 is aligned in the same direction as the magnetization direction of the reference layer 33. As a result, the magnetization direction of the reference layer 33 and the magnetization direction of the storage layer 31 are arranged in parallel. In this parallel state, the resistance change element VR has the lowest resistance value. This case is defined as "0" data, for example.

On the other hand, as shown in FIG. 3C, when a current flows from the reference layer 33 to the storage layer 31, i.e., when electrons going from the storage layer 31 to the reference layer 33 are supplied, the electrons are reflected by the reference layer 33, so that electrons spin-polarized in a direction opposite to the magnetization direction of the reference layer 33 are injected into the storage layer 31. In this case, the magnetization direction of the storage layer 31 is aligned in the opposite direction to the magnetization direction of the reference layer 33. As a result, the magnetization direction and the storage layer 31 and the magnetization direction of the reference layer 33 are antiparallel. In this antiparallel state, the resistance change element VR has the highest resistance value. This case is defined as "1" data, for example.

The reading from the resistance change element VR is performed as follows.

A read current is supplied to the resistance change element VR. This read current is set to a value (a value smaller than the writing current) in which the magnetization direction of the storage layer 31 is not inverted. The "0" data and "1" data can be read out by detecting the change in the resistance value of the resistance change element VR at this time.

As shown in FIG. 2, resistances R (R00-R03) are electrically coupled to the ends of the local bit lines LBL at the first column selection circuit 11 of the memory cell array 10. More specifically, the resistances R00-R03 are electrically coupled between the memory cell MC and first column selection circuit 11 (or sense amplifier 13). The first terminal of each of the resistances R00-R03 is electrically coupled to each of the local bit lines LBL0-LBL3, and the second terminal of each of the resistances R00-R03 is electrically coupled to the first column selection circuit 11.

The resistances R00-R03 have different resistance values. The resistance values of the resistances R00-R03 are set according to the resistance values of the local bit lines LBL0-LBL3, the resistance value of the resistance change element VR, and the resistance values of the local source lines LSL0-LSL3. The resistance values of the local bit lines LBL0-LBL3, the resistance value of the resistance change element VR, and the resistance values of the local source lines LSL0-LSL3 are different depending on the manufacturing process variation. For this reason, the resistance values of resistances R00-R03 are adjusted so as to correct the resistance values of the coupled local bit lines LBL0-LBL3, the resistance value of the resistance change element VR, and the resistance values of the local source lines LSL0-LSL3. More specifically, the resistance values of the resistances R00-R03 are set so as to make the following total resistance values be equivalent: the total resistance value of the resistance R00, the local bit line LBL0, the resistance change element VR coupled to the local bit line LBL0, and the local source line LSL0; the total resistance value of the resistance R01, the local bit line LBL1, the resistance change element VR coupled to the local bit line LBL1, and the local source line LSL1; the total resistance value of the resistance R02, the local bit line LBL2, the resistance change element VR coupled to the local bit line LBL2, and the local source line LSL2; and the total resist resistance value of the resistance R03, the local bit line LBL3, the resistance change element VR coupled to the local bit line LBL3, and the local source line LSL3. More specifically, a resistance R having a low resistance value is electrically coupled to a local bit line LBL, a resistance change element VR, and a local source line LSL of which total resistance value is high, and a resistance R having a high resistance value is electrically coupled to a local bit line LBL, a resistance change element VR, and a local source line LSL of which total resistance value is low.

The first column selection circuit 11 includes first column selection transistors 11_0-11_3. The first terminals of the first column selection transistors 11_0-11_3 are electrically coupled to the local hit lines LBL0-LBL3 via the resistances R00-R03, respectively. More specifically, the first terminals of the resistances R00-R03 are electrically coupled to the local bit lines LBL0-LBL3, respectively, and the second terminals of the resistances R00-R03 are electrically coupled to the first terminals of the first column selection transistors 11_0-11_3, respectively. The second terminals of the first column selection transistors 11_0-11_3 are commonly electrically coupled to the global bit line GBL. The control terminals of the first column selection transistors 11_0-11_3 are electrically coupled to the column selection control lines CSL0-CSL3, respectively.

The second column selection circuit 15 includes second column selection transistors 15_0-15_3. The first terminals of the second column selection transistors 15_0-15_3 are electrically coupled to the local source lines LSL0-LSL3, respectively. The second terminals of the second column selection transistors 15_0-15_3 are commonly electrically coupled to the global source line CSL. The control terminals of the second column selection transistors 15_0-15_3 are electrically coupled to the column selection control lines CSL0-CSL3, respectively.

It should be noted that the column selection control lines CSL0-CSL3 of the first column selection circuit 11 and the column selection control lines CSL0-CSL3 of the second column selection circuit 15 are different control lines. Control signals from different control circuits are provided to the column selection control lines CSL0-CSL3 of the first column selection circuit 11 and the column selection control lines CSL0-CSL3 of the second column selection circuit 15. These control signals execute the same operation. More specifically, the first column selection transistor 11_0 and the second column selection transistor 15_0 are turned ON/OFF at a time; the first column selection transistor 11_1 and the second column selection transistor 15_1 are turned ON/OFF at a time; the first column selection transistor 11_2 and the second column selection transistor 15_2 are turned ON/OFF at a time; and the first column selection transistor 11_3 and the second column selection transistor 15_3 are turned ON/OFF at a time.

Effect of First Embodiment

Figure 4:
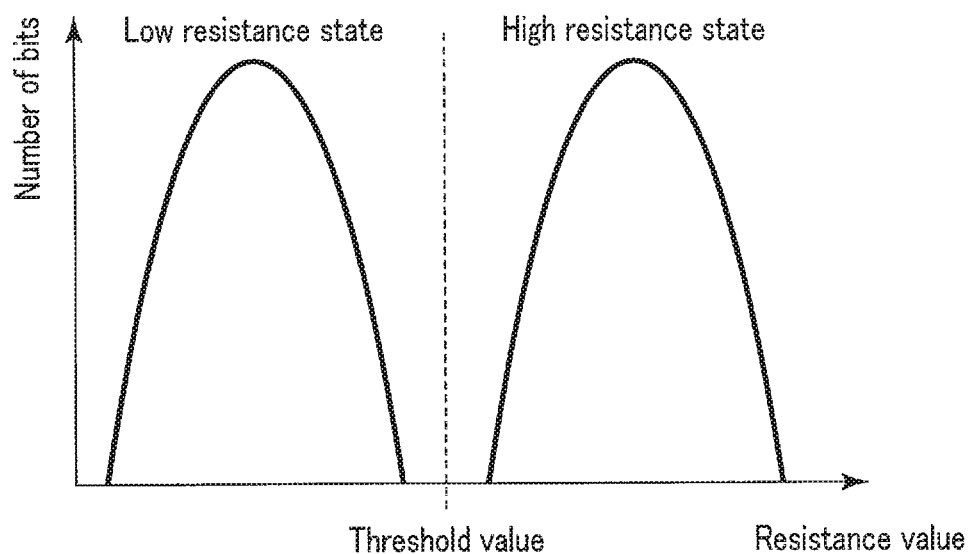
FIG. 4 shows a resistance state distribution of a normal resistance change element VR.
Figure 5:
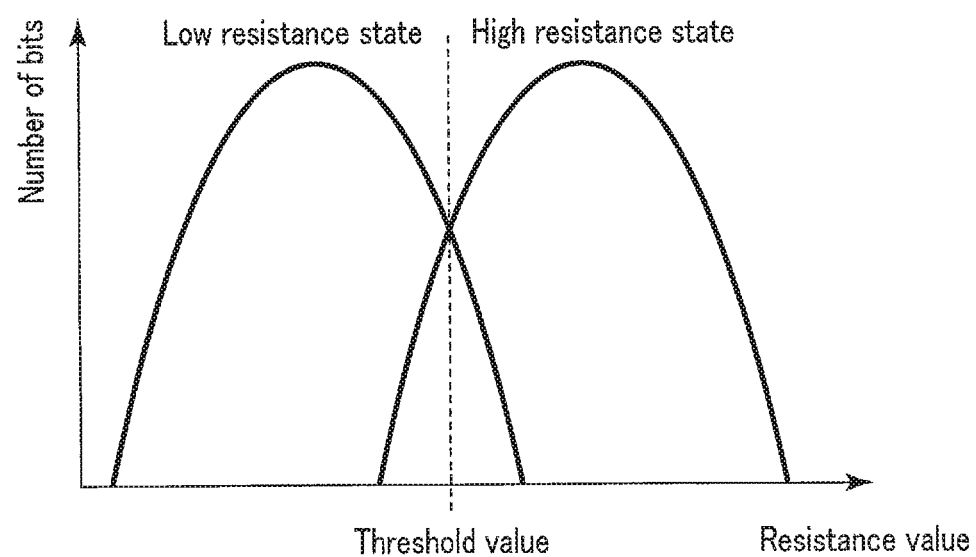
FIG. 5 shows a resistance state distribution of a resistance change element VR when a defective hit occurs.

FIG. 4 is a figure showing a resistance state distribution of the normal resistance change element VR (when a defective bit does not occur). FIG. 5 is a figure showing the resistance state distribution of the resistance change element VR when a defective bit occurs.

As shown in FIG. 4, in data writing in an MRAM, two states of high resistance state and low resistance state are generated by changing resistance value of resistance change element VR. Although the high resistance state and the low resistance state each has a variation, there is a margin between the distribution of the high resistance state and the distribution of the low resistance state in the normal state. Within this margin, a threshold value is set in reading. In the case of the high resistance state, a normal bit is made if the resistance value is higher than the threshold value. In the case of the low resistance state, a normal bit is made if the resistance value is lower than the threshold value.

On the other hand, when variations occur in the size of each wire (for each of the local bit lines LBL0-LBL3, for each of the resistance change elements VR, for each of the local source lines LSL0-LSL3, and for each of the word lines WL0-WL3) due to variations in the manufacturing process. Therefore, the resistance value differs for each wire. In this case, as shown in FIG. 5, the dispersion of the resistance value increases in reading. As a result, there is no margin between the high resistance state and the low resistance state, and a part of the high resistance state and the low resistance state overlap. These overlapping portions are defective bits. More specifically, in the low resistance state, the right end (high resistance side) of the distribution becomes defective, and in the high resistance state, the left end of the distribution (low resistance side) becomes defective. As a result, both ends of the distribution become defective.

On the other hand, in the first embodiment, the resistances R00-R03 are electrically coupled to the ends of the local bit lines LBL0-LBL3, respectively. The resistance values of the resistances R00-R03 are set so as to make the following total resistance values be equivalent: the total resistance value of the resistance R00, the local bit line LBL0, the resistance change element VR coupled to the local bit line LBL0, and the local source line LSL0; the total resistance value of the resistance R01, the local bit line LBL1, the resistance change element VR coupled to the local bit line LBL1, and the local source line LSL1; the total resistance value of the resistance R02, the local bit line LBL2, the resistance change element VR coupled to the local bit line LBL2, and the local source line LSL2; and the total resistance value of the resistance R03, the local bit line LBL3, the resistance change element VR coupled to the local bit line LBL3, and the local source line LSL3. Therefore, it is possible to correct variations in the resistance value caused by variations in manufacturing of the local bit lines LBL0-LBL3, the resistance change element VR, and the local source lines LSL0-LSL3. As a result, it is possible to reduce defective bits in reading caused by variations in manufacturing of the local bit lines LBL0-LBL3, the resistance change element VR, and the local source lines LSL0-LSL3. Such a couple of the resistances R00-R03 can be applied when the resistance values of the local bit lines LBL0-LBL3, the resistance change element VR, and the local source lines LSL0-LSL3 can be specified at the manufacturing stage.

Second Embodiment

A semiconductor storage device according to the second embodiment will be described below with reference to FIGS. 6 to 8. In the first embodiment described above, resistances R00-R03 are electrically coupled to local bit lines LBL0-LBL3, respectively. In the second embodiment, variable resistance circuits VRCB0-VRCB3 including fuses F30-F3$n$ and resistances R30-R3$n$, respectively, are coupled to local bit lines LBL0-LBL3, respectively. Hereinafter, the second embodiment will be explained in detail.

In the second embodiment, the difference from the first embodiment will be mainly described, and similar features will not be explained.

Configuration Example of Second Embodiment

Figure 6:
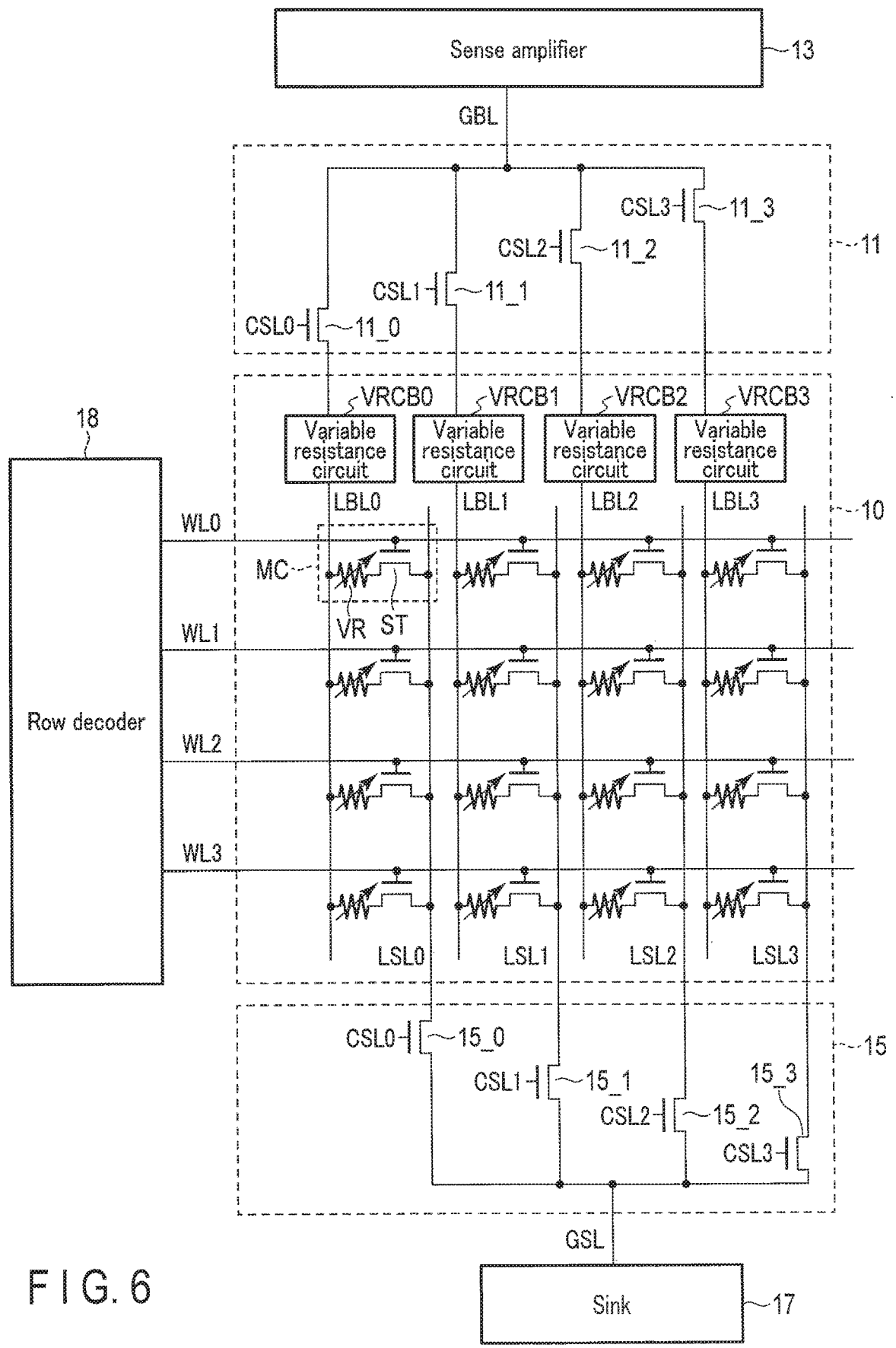
FIG. 6 is a circuit diagram showing a memory cell array, a first column selection circuit, and a second column selection circuit in the semiconductor storage device according to the second embodiment in more detail.

FIG. 6 is a circuit diagram showing in more detail memory cell array 10, a first column selection circuit 11, and a second column selection circuit 15 in the semiconductor storage device according to the second embodiment.

As shown in FIG. 6, the variable resistance circuit VRCB (VRCB0-VRCB3) are electrically coupled to the ends of the local bit lines LBL at the first column selection circuit 11 of the memory cell array 10. More specifically, the variable resistance circuits VRCB0-VRCB3 are electrically coupled between the memory cell MC and the first column selection circuit 11 (or the sense amplifier 13). The first terminals of the variable resistance circuits VRCB0-VRCB3 are electrically coupled to the local bit lines LBL0-LBL3, respectively. The second terminals of the variable resistance circuits VRCB0-VRCB3 are electrically coupled to the first column selection circuit 11.

The first terminals of the first column selection transistors 11_0-11_3 are electrically coupled via the variable resistance circuits VRCB0-VRCB3 to the local bit lines LBL0-LBL3, respectively. More specifically, the first terminals of the variable resistance circuits VRCB0-VRCB3 are electrically coupled to the local bit lines LBL0-LBL3, respectively. The second terminals of the variable resistance circuits VRCB0-VRCB3 are electrically coupled to the first terminals of the first column selection transistors 11_0-11_3, respectively.

Figure 7:
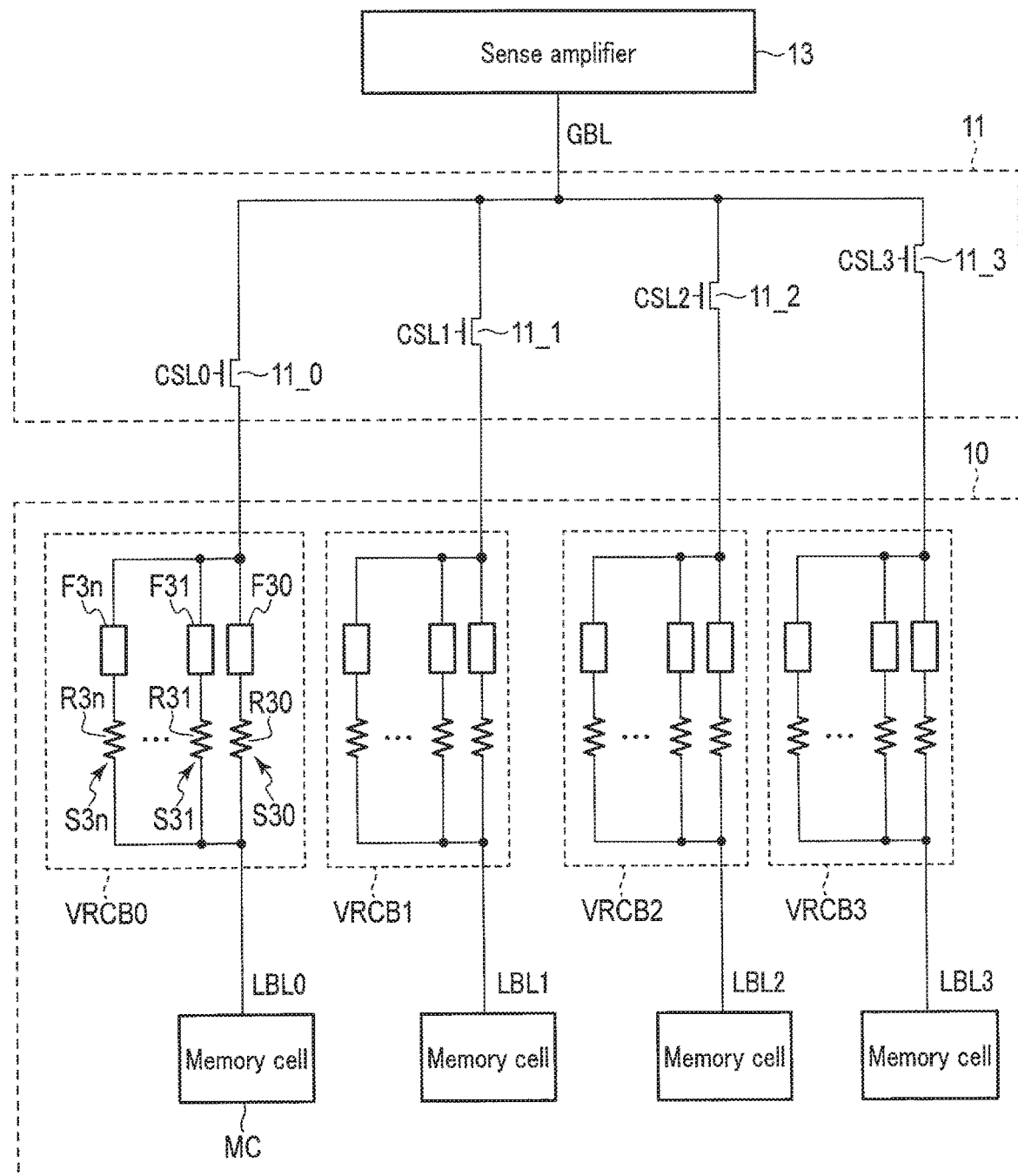
FIG. 7 is a circuit diagram showing variable resistance circuits in the semiconductor storage device according to the second embodiment in more detail.

FIG. 7 is a circuit diagram showing the variable resistance circuit VRCB in the semiconductor storage device according to the second embodiment in more detail. It should be noted that the configurations of the variable resistance circuits VRCB0-VRCB3 are similar, and therefore, the configuration of the variable resistance circuit VRCB0 will be explained.

As shown in FIG. 7, the variable resistance circuit VRCB0 includes series circuits S30-S3$n$ (n is an integer of 1 or more). The series circuits S30-S3$n$ are electrically coupled in parallel with each other. The first terminals of the series circuits S30-S3$n$ are commonly electrically coupled to the local bit line LBL0. The second terminals of the series circuits S30-S3$n$ are commonly electrically coupled to the first terminal of the first column selection transistor 11_0.

The series circuit S30 includes a resistance R30 and a fuse F30. The resistance R30 and the fuse F30 are electrically coupled in series with each other. The first terminal of resistance R30 is electrically coupled to local bit line LBL0. The second terminal of resistance R30 is electrically coupled to the first terminal of fuse F30. The second terminal of the fuse F30 is electrically coupled to the first terminal of the first column selection transistor 11_0.

It should be noted that the couple of the series circuit S30 may be reversed. More specifically, the fuse F30 and the resistance R30 may be coupled in this order from the memory cell MC.

The series circuits S31-S3n have configurations similar to the series circuit S30.

More specifically, the series circuit S31 includes a resistance R31 and a fuse F31. The resistance R31 and fuse F31 are electrically coupled in series with each other. The first terminal of resistance R31 is electrically coupled to the local bit line LBL0. The second terminal of resistance R31 is electrically coupled to the first terminal of fuse F31. The second terminal of the fuse F31 is electrically coupled to the first terminal of the first column selection transistor 11_0.

The series circuit S3n includes a resistance R3n and a fuse F3n. The resistance R3n and the fuse F3n are electrically coupled in series with each other. The first terminal of resistance R3n is electrically coupled to local bit line LBL0. The second terminal of resistance R3n is electrically coupled to the first terminal of the fuse F3n. The second terminal of fuse F3n is electrically coupled to the first terminal of first column selection transistor 11_0.

In the variable resistance circuit VRCB0, the resistances R30-R3n have an equivalent resistance value. In the variable resistance circuits VRCB1-VRCB3, the resistances R30-R3n have resistance values equivalent to the resistances R30-R3n of the variable resistance circuit VRCB0.

Figure 8:
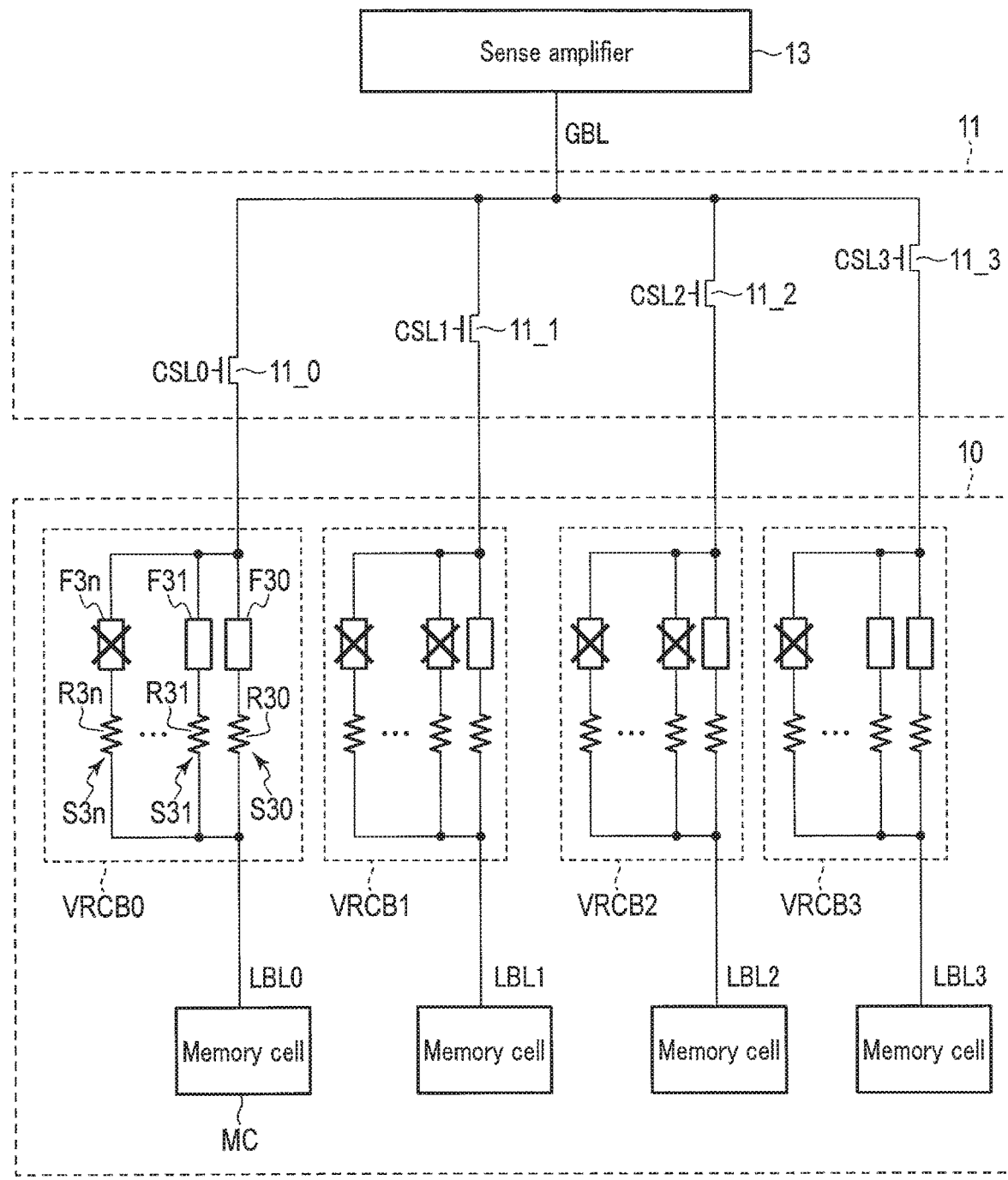
FIG. 8 is a circuit diagram showing an operation example of variable resistance circuits in the semiconductor storage device according to the second embodiment.

FIG. 8 is a circuit diagram showing an operation example of variable resistance circuits VRCB in the semiconductor storage device according to the second embodiment.

In this example, in the final process of the manufacturing process, the resistance value of the local bit line LBL, the resistance value of the resistance chance element VR, and the resistance value of the local source line LSL are measured, the fuses F30-F3n of the variable resistance circuit VRCB are appropriately discoupled by overcurrent in accordance with these resistance values. As a result, the number of parallel resistances R30-R3n coupled to the local bit line LBL is adjusted, and the resistance value of the variable resistance circuit VRCB is appropriately adjusted. Here, the resistance value of the variable resistance circuit VRCB can be increased by increasing the number of discoupled fuses F30-F3n (by reducing the number of parallel current paths). The resistance value of the variable resistance circuit VRCB can be decreased by decreasing the number of discoupled fuses F30-F3n (by increasing the number of parallel current paths).

The resistance values of the variable resistance circuits VRCB0-VRCB3 are set so as to make the following total resistance values be equivalent: the total resistance value of the variable resistance circuit VRCB0, the local bit line LBL0, the resistance change element VR coupled to the local bit line LBL0, and the local source line LSL0 the total resistance value of the variable resistance circuit VRCB1, the local bit line LBL1, the resistance change element VR coupled to the local bit line LBL1, and the local source line LSL1; the total resistance value of the variable resistance circuit VRCB2, the local bit line LBL2, the resistance change element VR coupled to the local bit line LBL2, and the local source line LSL2; and the total resistance value of the variable resistance circuit VRCB3, the local bit line LBL3, the resistance change element VR coupled to the local bit line LBL3, and the local source line LSL3. More specifically, a low resistance value is set for the variable resistance circuit VRCB electrically coupled to the local bit line LBL, the resistance change element VR, and the local source line LSL of which high total resistance value is high. A high resistance value is set for the variable resistance circuit VRCB electrically coupled to the local bit line LBL, the resistance change element VR, and the local source line LSL of which total resistance value is high.

FIG. 8 shows a case in which the total resistance value of the local bit line LBL0, the resistance change element VR coupled to the local bit line LBL0, and the local source line LSL0, and the total resistance value of the local bit line LBL3, the resistance change element VR coupled to the local bit line LBL3, and the local source line LSL3 are high, and the total resistance value of the local bit line LBL1, the resistance change element VR coupled to the local bit line LBL1, and the local source line LSL1, and the total resistance value of the local bit line LBL2, the resistance change element VR coupled to the local bit line LBL2, and the local source line LSL2 are low.

As shown in FIG. 8, in the local bit line LBL0, the resistance change element VR coupled to the local bit line LBL0, and the local source line LSL0 of which total resistance value is high, the fuses F32 (not shown)-F3n in the variable resistance circuit VRCB0 are cut off. Accordingly, the parallel resistances R30, R31 are electrically coupled to the local bit line LBL0, the resistance change element VR coupled to the local bit line LBL0, and the local source line LSL0. On the other hand, in the local bit line LBL1, the resistance change element VR coupled to the local bit line LBL1, and the local source line LSL1 of which total resistance value is low, the fuses F31-F3n of the variable resistance circuit VRCB1 are cut off. Accordingly, only the resistance R30 is electrically coupled to the local bit line LBL1, the resistance change element VR coupled to the local bit line LBL1, and the local source line LSL1. In the variable resistance circuit VRCB2, the fuses are cut off in a manner similar to the variable resistance circuit VRCB1. In the variable resistance circuit VRCB3, the fuses are cut off in a manner similar to the variable resistance circuit VRCB0.

If variations due to the manufacturing process are larger and it is difficult to make correction even by the variable resistance circuit VRCB, the memory cell MC is replaced with row redundancy or column redundancy in the final process of the manufacturing process (e.g. test process).

Effect of Second Embodiment

In the second embodiment, the variable resistance circuits VRCB0-VRCB3 including the fuses F30-F3n and the resistances R30-R3n are electrically coupled to the ends of the local bit lines LBL0-LBL3, respectively. The resistance values of the variable resistance circuits VRCB0-VRCB3 are set so as to make the following total resistance values be equivalent: the total resistance value of the variable resistance circuit VRCB0, the local bit line LBL0, the resistance change element VR coupled to the local bit line LBL0, and the local source line LSL0; the total resistance value of the variable resistance circuit VRCB1, the local bit line LBL1, the resistance change element VR coupled to the local bit line LBL1, and the local source line LSL1; the total resistance value of the variable resistance circuit VRCB2, the local bit line LBL2, the resistance change element VR coupled to the local bit line LBL2, and the local source line LSL2; and the variable resistance circuit VRCB3, the local bit line LBL3, the resistance change element VR coupled to the local bit line LBL3, and the local source line LSL3. Thus, the same effect as the first embodiment can be obtained.

The first embodiment is applicable when the resistance values of the local bit lines LBL0-LBL3, the resistance change element VR, and the local source lines LSL0-LSL3 may be identified in advance in the manufacturing stage. In contrast, in the second embodiment, the resistance value of the variable resistance circuit VRCB can be set by adjusting the number of disconnected fuses F30-F3$n$. Therefore, after the resistance values of the local bit lines LBL0-LBL3, the resistance change element VR, and the local source lines LSL0-LSL3 are measured in the final process of the manufacturing process, the resistance value of the variable resistance circuit VRCB can be set according to these variations. Therefore, it is possible to more accurately correct the variation of the resistance value caused by variations in manufacturing in the local bit lines LBL0-LBL3, the resistance change element VR, and the local source lines LSL0-LSL3.

Further, the variable resistance circuit VRCB can set the resistance value with many resistances R30-F3$n$ and the fuses F30-F3$n$. Therefore the resistance value of variable resistance circuit VRCB can be finely set according to the local bit lines LBL0-LBL3, the resistance change element VR, and the local source lines LSL0-LSL3. Therefore, it is possible to correct the variation of the resistance value caused by variations in manufacturing of the local bit lines LBL0-LBL3 more accurately.

A resistance change element may be coupled instead of variable resistance circuit VRCB. The resistance change element includes, for example, an MTJ element, a phase change element, a ferroelectric element, and the like.

Third Embodiment

A semiconductor storage device according to the third embodiment will be described below with reference to FIG. 9 and FIG. 10. In the second embodiment above, the variable resistance circuits VRCB0-VRCB3 include the resistances R30-R3$n$ and the fuses F30-F3$n$. In the third embodiment, the variable resistance circuits VRCB0-VRCB3 including transistor T30-T3$n$ and resistances R30-R3$n$ are electrically coupled to the local bit lines LBL0-LBL3, respectively. Hereinafter, the third embodiment will be explained in detail.

In the third embodiment, the difference from the second embodiment will be mainly described, and similar features will not be explained.

Configuration Example of Third Embodiment

Figure 9:
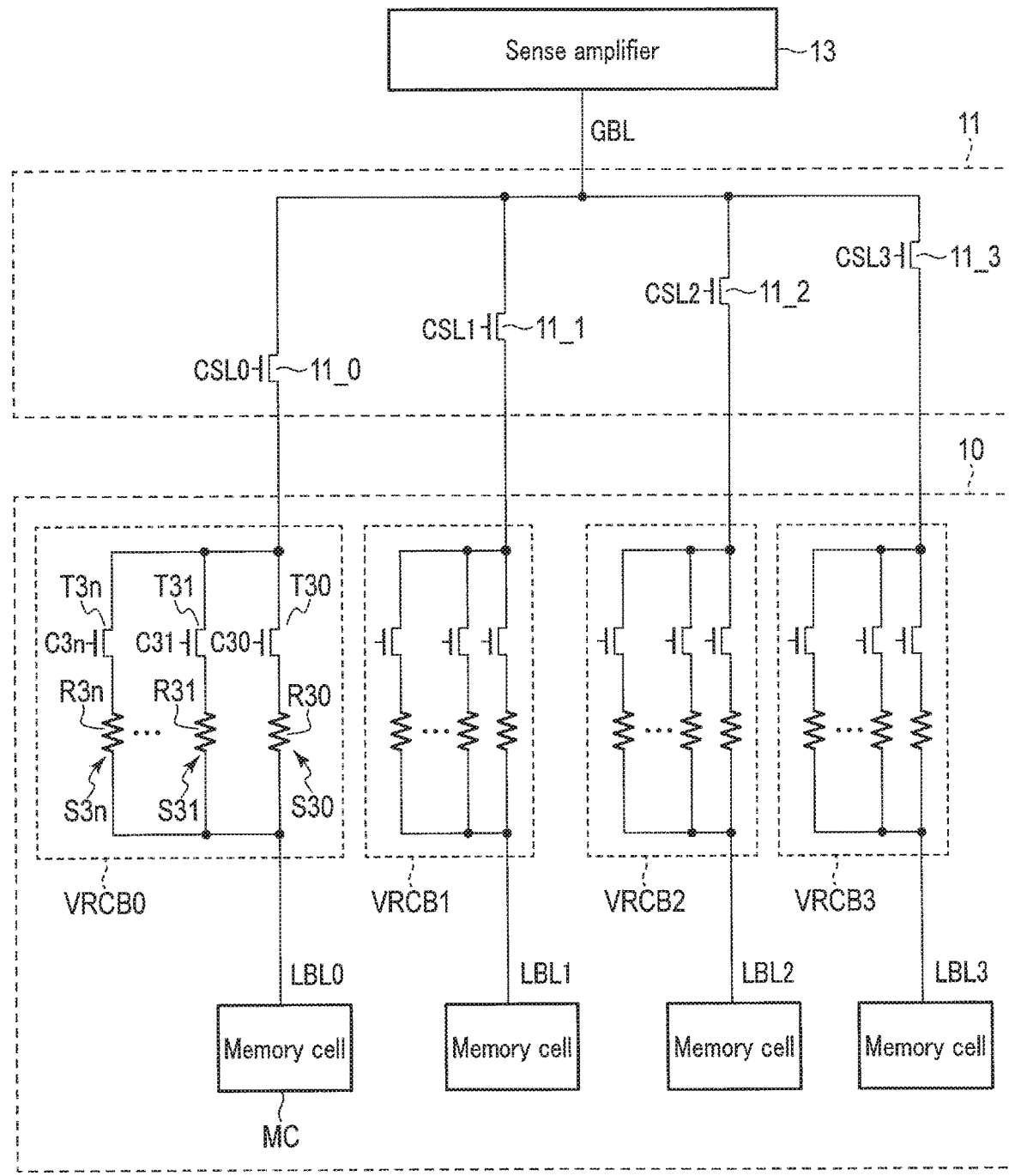
FIG. 9 is a circuit diagram showing variable resistance circuits in the semiconductor storage device according to a third embodiment in more detail.

FIG. 9 is a circuit diagram showing variable resistance circuits VRCB of the semiconductor storage device according to the third embodiment in more detail. It should be noted that the configurations of the variable resistance circuits VRCB0-VRCB3 are similar, and therefore, the configuration of the variable resistance circuit VRCB0 will be hereinafter explained.

As shown in FIG. 9, the variable resistance circuit VRCB0 includes series circuits S30-S3$n$. The series circuit S30 includes a resistance R30 and transistor T30. The resistance R30 and the transistor T30 are electrically coupled in series with each other. The first terminal of resistance R30 is electrically coupled to local bit line LBL0. The second terminal of resistance R30 is electrically coupled to the first terminal of transistor T30. The second terminal of the transistor T30 is electrically coupled to the first terminal of the first column selection transistor 11_0. The control terminal of the transistor T30 is electrically coupled to the control line C30.

The series circuits S31-S3$n$ have a configuration similar to the series circuit S30.

More specifically, the series circuit S31 includes a resistance R31 and transistor T31. The resistance R31 and the transistor T31 are electrically coupled in series with each other. The first terminal of resistance R31 is electrically coupled to local bit line LBL0. The second terminal of resistance R31 is electrically coupled to the first terminal of transistor T31. The second terminal of the transistor T31 is electrically coupled to the first terminal of the first column selection transistor 11_0. The control terminal of the transistor T31 is electrically coupled to the control line C31.

The series circuit S3$n$ includes a resistance R3$n$ and transistor T3$n$. The resistance R3$n$ and transistor T3$n$ is electrically coupled in series with each other. The first terminal of resistance R3$n$ is electrically coupled to local bit line LBL0. The second terminal of resistance R3$n$ is electrically coupled to the first terminal of transistor T3$n$. The second terminal of the transistor T3$n$ is electrically coupled to the first terminal of the first column selection transistor 11_0. The control terminal of the transistor T3$n$ is electrically coupled to the control line C3$n$.

The control lines C30-C3$n$ are supplied with a predetermined voltage from a control circuit (not shown), so that the ON/OFF states of the transistors T30-T3$n$ are controlled.

Figure 10:
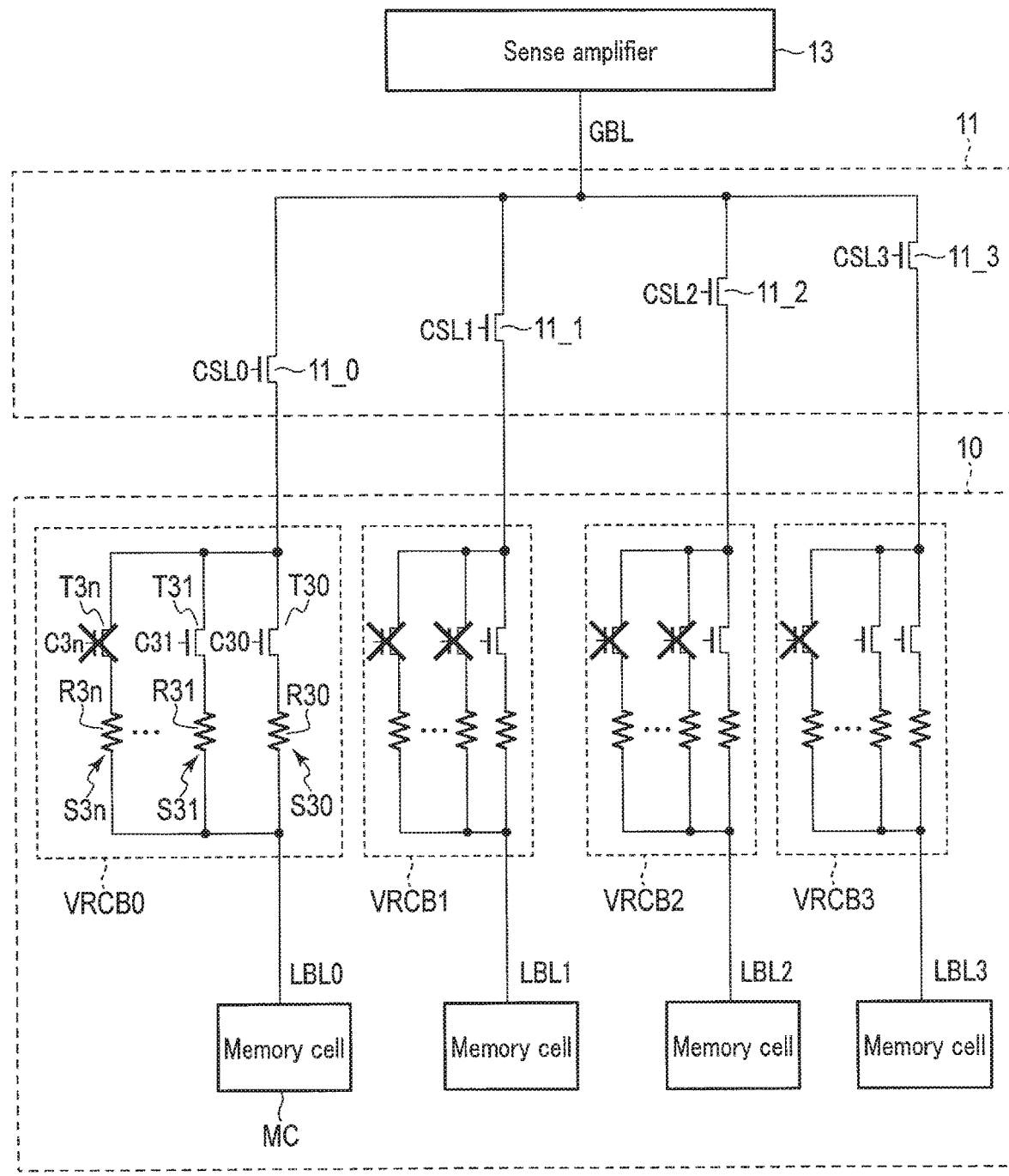
FIG. 10 is a circuit diagram showing an operation example of variable resistance circuits in the semiconductor storage device according to the third embodiment.

FIG. 10 is a circuit diagram showing operation example of the variable resistance circuit VRCB in the semiconductor storage device according to the third embodiment.

In this example, the resistance value of the local bit line LBL, the resistance value of the resistance change element VR, and the resistance value of the local source line LSL are measured in various operations after shipment, and in accordance with these resistance values, the ON/OFF states of the transistors T30-T3$n$ of the variable resistance circuit VRCB are controlled. As a result, the number of parallel resistances R30-R3$n$ coupled to the local bit line LBL is adjusted, and the resistance value of the variable resistance circuit VRCB is adjusted accordingly. Here, the resistance value of the variable resistance circuit VRCB can be increased by increasing the number of transistors T30-T3$n$ to be turned OFF (by reducing the number of parallel current paths). The resistance value of the variable resistance circuit VRCB can be decreased by decreasing the number of transistors T30-T3$n$ to be turned OFF (by increasing the number of parallel current paths).

FIG. 10 shows a case where the total resistance value of the local bit line LBL, the resistance change element VR coupled to the local bit line LBL0, and the local source line LSL0, and the total resistance value of the local bit line LBL3, the resistance change element VR coupled to the local bit line LBL3, and the local source line LSL3 are high, and the total resistance value of the local bit line LBL1, the resistance change element VR coupled to the local bit line LBL1, and the local source line LSL1, and the total resistance value of the local bit line LBL2, the resistance change element VR coupled to the local bit line LBL2, and the local source line LSL2 are low.

As shown in FIG. 10, in the local bit line LBL0, the resistance change element VR coupled to the local bit line LBL0, and the local source line LSL0 of which total resistance value is high, the transistors T32 (not shown)-T3$n$ are turned OFF and the transistors T30, T31 are turned ON in the variable resistance circuit VRCB0. As a result, the parallel resistances R30 and R31 are electrically coupled to the local bit line LBL0, the resistance change element VR coupled to the local bit line LBL0, and the local source line LSL0. On the other hand, in the local bit line LBL1, the resistance change element VR coupled to the local bit line LBL1, and the local source line LSL1 of which total resistance value is low, the transistors T31-T3$n$ are turned OFF, and the transistor T30 is turned ON in the variable resistance circuit VRCB1. As a result, only the resistance R30 is electrically coupled to the local bit line LBL1, the resistance change element VR coupled to the local bit line LBL1, and the local source line LSL1. In the variable resistance circuit VRCB2, the transistors are turned ON/OFF in a manner similar to the variable resistance circuit VRCB1. In the variable resistance circuit VRCB3, the transistors are turned ON/OFF in a manner similar to the variable resistance circuit VRCB0.

Effect of Third Embodiment

In the third embodiment, the variable resistance circuits VRCB0-VRCB3 including the transistors T30-T3$n$ and the resistances R30-R3$n$ are electrically coupled to the ends of the local bit lines LBL0-LBL3, respectively. Thus, the same effect as the second embodiment can be obtained.

In the second embodiment, the resistance value of the variable resistance circuit VRCB can be set in the final process of the manufacturing process by adjusting the number of fuses F30-F3$n$ to be discoupled. In contrast, in the third embodiment, the resistance value of the variable resistance circuit VRCB is set by adjusting the ON/OFF states of the transistors T30-T3$n$. Therefore, even after shipment, the resistance value of the variable resistance circuit VRCB can be set appropriately. More specifically, even when the resistance value of the local bit line LBL, the resistance value of the resistance change element VR, and the resistance value of the local source line LSL vary due to causes other than manufacturing variations, the variations in the resistance value of the local bit line LBL, the resistance value of the resistance change element VR, and the resistance value in the local source line LSL can be corrected after the shipment.

Fourth Embodiment

A semiconductor storage device according to the fourth embodiment will be described below using FIG. 11. The fourth embodiment is a modification of the first embodiment explained above. In the fourth embodiment, the resistors R10-R13 are electrically coupled to the local source lines LSL0-LSL3, respectively. The fourth embodiment is applicable in place of the first embodiment explained above. Hereinafter, the fourth embodiment will be described in detail.

In the fourth embodiment, the difference from the first embodiment will be mainly described, and similar features will not be explained.

Configuration Example of Fourth Embodiment

Figure 11:
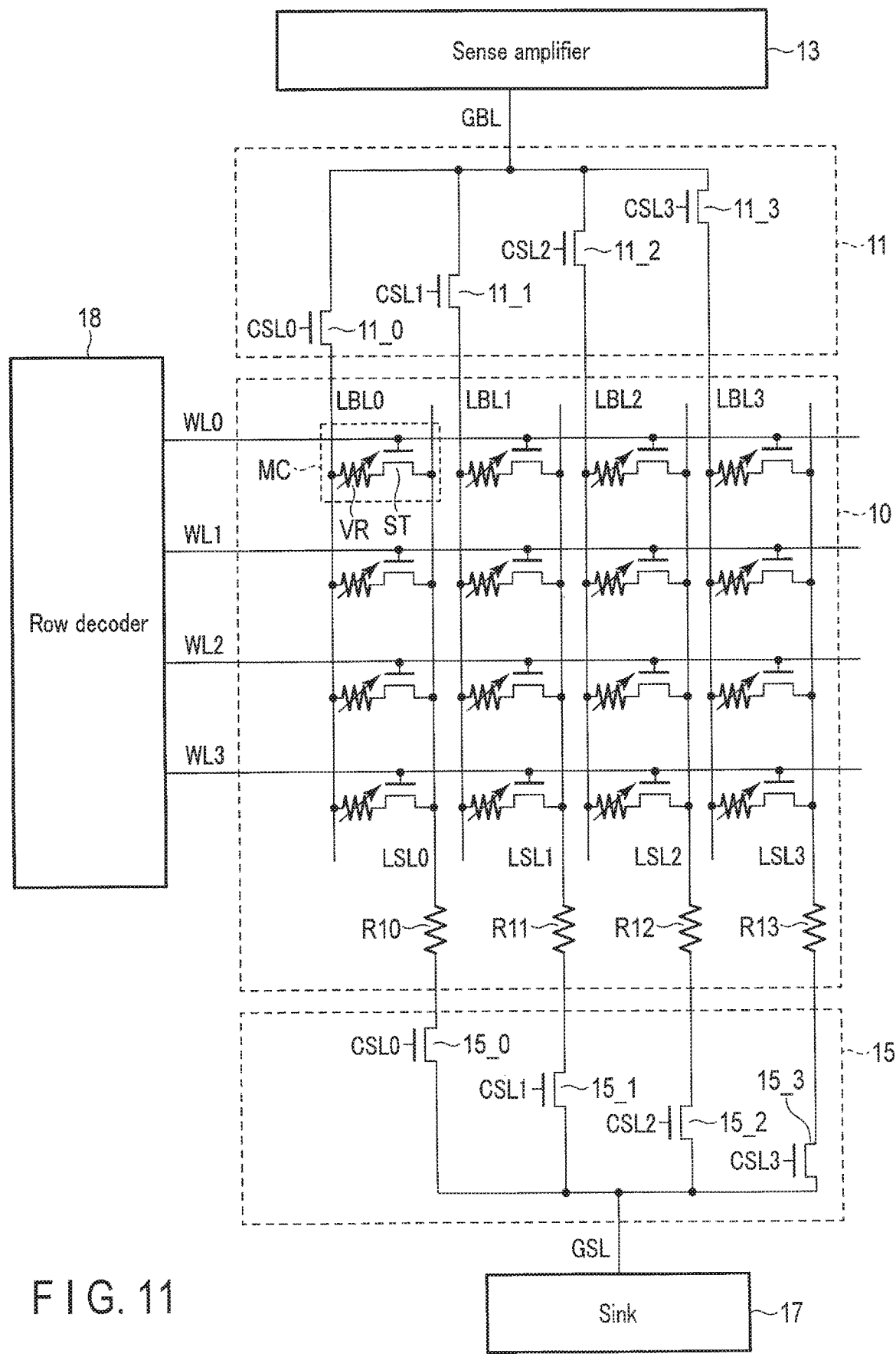
FIG. 11 is a circuit diagram showing a memory cell array, a first column selection circuit, and a second column selection circuit in the semiconductor storage device according to a fourth embodiment in more detail.

FIG. 11 is a circuit diagram showing a memory cell array 10, first column selection circuit 11, and second column selection circuit 15 in the semiconductor storage device according to the fourth embodiment in more detail.

As shown in FIG. 11, the resistances R10-R13 are electrically coupled to the ends of the local source lines LSL at the second column selection circuit 15 of the memory cell array 10. More specifically, the resistances R10-R13 are electrically coupled between the memory cell MC and the second column selection circuit 15 (or the sink 17). The first terminals of the resistances R10-R13 are electrically coupled to the local source lines LSL0-LSL3, respectively. The second terminals of the resistances R10-R13 are electrically coupled to the second column selection circuit 15.

The resistances R10-R13 have resistance values different from each other. The resistance values of resistances R10-R13 are set according to the resistance value of the local bit lines LBL0-LBL3 and the local source lines LSL0-LSL3 to be coupled. More specifically, the resistance values of the resistances R10-R13 are set so as to make the following total resistance values be equivalent: the total resistance value of the resistance R10, the local bit line LBL0, the resistance change element VR coupled to the local bit line LBL0, and the local source line LSL0; the total resistance value of the resistance R11, the local bit line LBL1, the resistance change element VR coupled to the local bit line LBL1, and the local source line LSL1; the total resistance value of the resistance R12, the local bit line LBL2, the resistance change element VR coupled to the local bit line LBL2, and the local source line LSL2; and the total resistance value of the resistance R13, the local bit line LBL3, the resistance change element VR coupled to the local bit line LBL3, and the local source line LSL3.

The first terminals of the second column selection transistors 15_0-15_3 are electrically coupled to the local source lines LSL0-LSL3 via the resistances R10-R13, respectively. More specifically, the first terminals of the resistances R10-R13 are electrically coupled to the local source lines LSL0-LSL3, respectively. The second terminals of the resistances R10-R13 are electrically coupled to the first terminals of the second column selection transistor 15_0-15_3, respectively.

Effect of Fourth Embodiment

In the fourth embodiment, the resistances R10-R13 are electrically coupled to the ends of the local source lines LSL0-LSL3, respectively. Thus, the same effect as the first embodiment can be obtained.

Fifth Embodiment

A semiconductor storage device according to the fifth embodiment will be described below with reference to FIG. 12 and FIG. 13. The fifth embodiment is a modification of the second embodiment explained above. In the fifth embodiment, variable resistance circuits VRCS0-VRCS3 including fuses F40-F4$n$ and resistances R40-R4$n$ are electrically coupled to local source lines LSL0-LSL3, respectively. The fifth embodiment can be applied in place the second embodiment explained above. Hereinafter, the fifth embodiment will be described in detail.

In the fifth embodiment, the difference from the second embodiment will be mainly described, and similar features will not be explained.

Configuration of Fifth Embodiment

Figure 12:
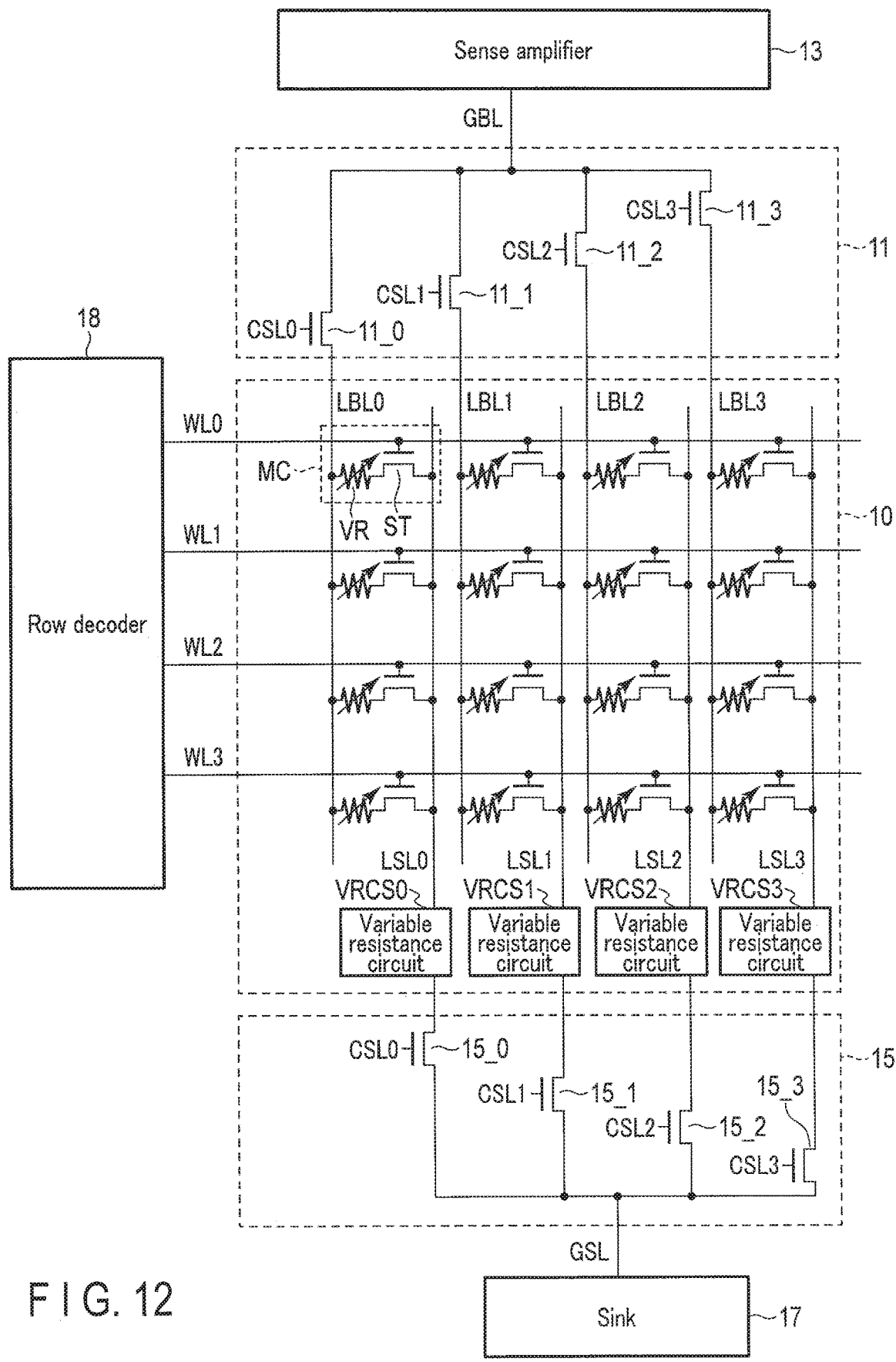
FIG. 12 is a circuit diagram showing a memory cell array, a first column selection circuit, and a second column selection circuit in the semiconductor storage device according to a fifth embodiment in more detail.

FIG. 12 is a circuit diagram showing a memory cell array 10, a first column selection circuit 11, and a second column selection circuit 15 in the semiconductor storage device according to the fifth embodiment in more detail.

As shown in FIG. 12, the variable resistance circuits VRCS (VRCS0-VRCS3) are electrically coupled to the ends of the local source lines LSL at the second column selection circuit 15 of the memory cell array 10. More specifically, the variable resistance circuits VRCS0-VRCS3 are electrically coupled between the memory cell MC and the second column selection circuit 15 (or sink 17). The first terminals of the variable resistance circuits VRCS0-VRCS3 are electrically coupled to the local source lines LSL0-LSL3, respectively. The second terminals of the variable resistance circuits VRCS0-VRCS3 are electrically coupled to the second column selection circuit 15.

The first terminals of the second column selection transistors 15_0-15_3 are electrically coupled to the local source lines LSL0-LSL3 via the variable resistance circuits VRCS0-VRCS3, respectively. More specifically, the first terminals of the variable resistance circuits VRCS0-VRCS3 are electrically coupled to the local source lines LSL0-LSL3, respectively. The second terminals of the variable resistance circuits VRCS0-VRCS3 are electrically coupled to the first terminals of the second column selection transistors 15_0-15_3, respectively.

FIG. 13 is a circuit diagram showing the variable resistance circuit VRCS in the semiconductor storage device according to the fifth embodiment in more detail. The configurations of the variable resistance circuits VRCS0-VRCS3 are similar, and therefore, the configuration of the variable resistance circuit VRCS0 will be hereinafter explained.

As shown in FIG. 13, the variable resistance circuit VRCS0 includes series circuits S40-S4$n$. The series circuits S40-S4$n$ are electrically coupled in parallel with each other. The first terminals of the series circuits S40-S4$n$ are commonly electrically coupled to the local source line LSL0. The second terminals of the series circuits S40-S4$n$ are commonly electrically coupled to the first terminal of the second column selection transistor 15_0.

The series circuit S40 includes a resistance R40 and a fuse F40. The resistance R40 and the fuse F40 are electrically coupled in series with each other. The first terminal of the resistance R40 is electrically coupled to the local source line LSL0. The second terminal of the resistance R40 is electrically coupled to the first terminal of fuse F40. The second terminal of fuse F40 is electrically coupled to the first terminal of the second column selection transistor 15_0.

The series circuits S41-S4$n$ have a configuration similar to the series circuit S40.

More specifically, the series circuit S41 includes a resistance R41 and a fuse F41. The resistance R41 and the fuse F41 are electrically coupled in series with each other. The first terminal of the resistance R41 is electrically coupled to the local source line LSL0. The second terminal of resistance R41 is electrically coupled to the first terminal of fuse F41. The second terminal of the fuse F41 is electrically coupled to the first terminal of the second column selection transistor 15_0.

The series circuit S4$n$ includes a resistance R4$n$ and a fuse F4$n$. The resistance R4$n$ and the fuse F4$n$ are electrically coupled in series with each other. The first terminal of the resistance R4$n$ is electrically coupled to the local source line LSL0. The second terminal resistance R4$n$ is electrically coupled to the first terminal of fuse F4$n$. The second terminal of fuse F4$n$ is electrically coupled to the first terminal of second column selection transistor 15_0.

The resistances R40-R4$n$ in the variable resistance circuit VRCS0 has an equivalent resistance value. The resistances R40-R4$n$ in the variable resistance circuits VRCS1-VRCS3 have resistance values equivalent to the resistances R40-R4$n$, respectively, of the variable resistance circuit VRCS0.

Effect of Fifth Embodiment

In the fifth embodiment, the variable resistance circuits VRCS0-VRCS3 including the fuses F40-F4$n$ and the resistances R40-R4$n$ are electrically coupled to the ends of the local source lines LSL0-LSL3, respectively. Thus, the same effect as the second embodiment can be obtained.

Sixth Embodiment

A semiconductor storage device according to the sixth embodiment will be described below with reference to FIG. 14. The sixth embodiment is a modification of the third embodiment explained above. In the sixth embodiment, variable resistance circuits VRCS0-VRCS3 including transistors T40-T4$n$ and resistances R40-R4$n$ are electrically coupled to local source lines LSL0-LSL3, respectively. The sixth embodiment is applicable in place of the third embodiment above. Hereinafter, the sixth embodiment will be described in detail.

In the sixth embodiment, the difference from the third embodiment will be mainly described, and similar features will not be explained.

Configuration of Sixth Embodiment

FIG. 14 is a circuit diagram showing the variable resistance circuit VRCS according to the semiconductor storage device to the sixth embodiment in more detail. Since the configurations of the variable resistance circuits VRCS0-VRCS3 are similar, the configuration of the variable resistance circuit VRCS0 will be described below.

As shown in FIG. 14, the variable resistance circuit VRCS0 includes series circuits S40-S4$n$. The series circuit S40 includes a resistance R40 and a transistor T40. The resistance R40 and the transistor T40 are electrically coupled in series with each other. The first terminal of the resistance R40 is electrically coupled to the local source line LSL0. The second terminal of the resistance R40 is electrically coupled to the first terminal of transistor T40. The second terminal of the transistor T40 is electrically coupled to the first terminal of the second column selection transistor 15_0. The control terminal of the transistor T40 is electrically coupled to the control line C40.

The series circuits S41-S4$n$ have the same configuration as the series circuit S40.

More specifically, the series circuit S41 includes a resistance R41 and a transistor T41. The resistance R41 and the transistor T41 are electrically coupled in series with each other. The first terminal of the resistance R41 is electrically coupled to the local source line LSL0. The second terminal of resistance R41 is electrically coupled to the first terminal of transistor T41. The second terminal of the transistor T41 is electrically coupled to the first terminal of the second column selection transistor 15_0. The control terminal of the transistor T41 is electrically coupled to the control line C41.

The series circuit S4$n$ includes a resistance R4$n$ and a transistor T4$n$. The resistance R4$n$ and the transistor T4$n$ are electrically coupled in series with each other. The first terminal of resistance R4$n$ is electrically coupled to the local source line LSL0. The second terminal of resistance R4$n$ is electrically coupled to the first terminal of transistor T4$n$. The second terminal of the transistor T4$n$ is electrically coupled to the first terminal of the second column selection transistor 15_0. The control terminal of the transistor T4n is electrically coupled to the control line C4n.

The control lines C40-C4n are supplied with a predetermined voltage from a control circuit (not shown) so that the ON/OFF state of the transistors T40-T4n are controlled.

Effect of Sixth Embodiment

In the sixth embodiment, the variable resistance circuits VRCS0-VRCS3 including the transistors T40-T4n and the resistances R40-R4n are electrically coupled to the ends of the local source lines LSL0-LSL3, respectively. Thus, the same effect as the third embodiment can be obtained.

Seventh Embodiment

A semiconductor storage device according to the seventh embodiment will be described below with reference to FIG. 15. The seventh embodiment is a modification of the first embodiment explained above. In the seventh embodiment, the resistances R50-R53 are electrically coupled to the word line WL. The seventh embodiment may be combined with the first embodiment or the fourth embodiment explained above. The seventh embodiment will be described in detail below.

In the seventh embodiment, the difference from the first embodiment will be mainly described, and similar features will not be explained.

Configuration Example of Seventh Embodiment

FIG. 15 is a circuit diagram showing a memory cell array 10, a first column selection circuit 11, and a second column selection circuit 15 in the semiconductor storage device according to the seventh embodiment in more detail.

As shown in FIG. 15, the resistances R50-R53 are electrically coupled to the ends of the word lines WL at the row decoder 18 of the memory cell array 10. More specifically, the resistances R50-R53 are electrically coupled between the memory cell MC and the row decoder 18. The first terminals of resistances R50-R53 are electrically coupled to the word lines WL0-WL3, respectively. The second terminals of the resistances R50-R53 are electrically coupled to the row decoder 18.

The resistances R50-R53 have different resistance values. The resistance values of the resistances R50-R53 are set according to the resistance values of the word lines WL coupled. More specifically, the resistance values of the resistances R50-R53 are set so as to make the following total resistance values be equivalent: the total resistance values of the resistance R50 and the word line WL0; the total resistance value of the resistance R51 and the word line WL1; the total resistance value of the resistance R52 and the word line WL2; and the total resistance value of the resistance R53 and the word line WL3.

Effect of Seventh Embodiment

In the seventh embodiment, the resistances R50-R53 are electrically coupled to the ends of the word lines WL0-WL3, respectively. The resistance values of the resistances R50-R53 are set so as to make the following total resistance values be equivalent: the total resistance values of the resistance R50 and the word line WL0; the total resistance value of the resistance R51 and the word line WL1; the total resistance value of the resistance R52 and the word line WL2; and the total resistance value of the resistance R53 and the word line WL3. Thus, the same effect as the effect achieved with the local bit lines LBL0-LBL3 of the first embodiment can also be obtained with the word lines WL0-WL3.

Eighth Embodiment

A semiconductor storage device according to the eighth embodiment will be described below with reference to FIG. 16 and FIG. 17. The eighth embodiment is a modification of the second embodiment explained above. In the eighth embodiment, variable resistance circuits VRCS0-VRCS3 including fuses F40-F4n and resistances R40-R4n are electrically coupled to word lines WL0-WL3. The eighth embodiment may be combined with the second embodiment or the fifth embodiment explained above. Hereinafter, the eighth embodiment will be described in detail.

In the eighth embodiment, the difference from the second embodiment will be mainly described, and similar features will not be explained.

Configuration of Eighth Embodiment

FIG. 16 is a circuit diagram showing a memory cell array 10, a first column selection circuit 11, and a second column selection circuit 15 in the semiconductor storage device according to the eighth embodiment in more detail.

As shown in FIG. 16, the variable resistance circuits VRCW (VRCW0-VRCW3) are electrically coupled to the ends of the word lines WL at the row decoder 18 of the memory cell array 10. More specifically, the variable resistance circuits VRCW0-VRCW3 are electrically coupled between the memory cell MC and the row decoder 18. The first terminals of the variable resistance circuits VRCW0-VRCW3 are electrically coupled to the word lines WL0-WL3. The second terminals of the variable resistance circuits VRCW0-VRCW3 are electrically coupled to the row decoder 18.

Figure 17:
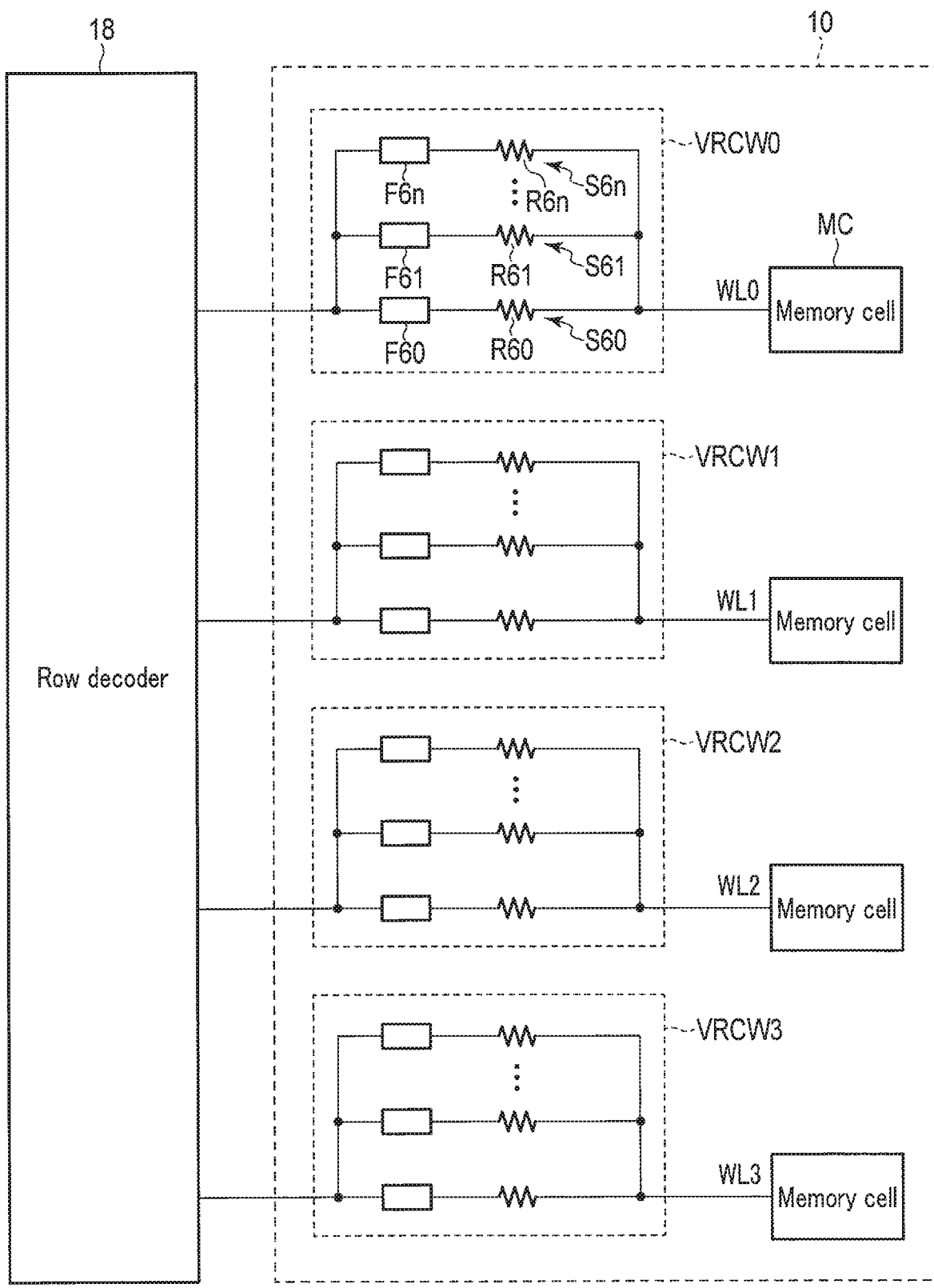
FIG. 17 is a circuit diagram showing variable resistance circuits in the semiconductor storage device according to the eighth embodiment in more detail.

FIG. 17 is a circuit diagram showing the variable resistance circuits VRCW in the semiconductor storage device according to the eighth embodiment in more detail. The configurations of the variable resistance circuits VRCW0-VRCW3 are similar, and therefore, the configuration of the variable resistance circuit VRCW0 will be hereinafter explained.

As shown in FIG. 17, the variable resistance circuit VRCW0 includes series circuits S60-S6n. The series circuits S60-S6n are electrically coupled in parallel with each other. The first terminals of the series circuits S60-S6n are commonly electrically coupled to the word line WL0. The second terminals of the series circuits S60-S6n are commonly electrically coupled to the row decoder 18.

The series circuit S60 includes a resistance R60 and a fuse F60. The resistance R60 and the fuse F60 are electrically coupled in series with each other. The first terminal of the resistance R60 is electrically coupled to the word line WL0. The second terminal of the resistance R60 is electrically coupled to the first terminal of the fuse F60. The second terminal of the fuse F60 is electrically coupled to the row decoder 18.

The series circuit S61-S6n has a configuration similar to the series circuit S60.

More specifically, the series circuit S61 includes a resistance R61 and a fuse F61. The resistance R61 and the fuse F61 are electrically coupled in series with each other. The first terminal of resistance R61 is electrically coupled to word line WL0. The second terminal of the resistance R61 is electrically coupled to the first terminal of fuse F61. The second terminal of the fuse F61 is electrically coupled to the row decoder 18.

The series circuit S6n includes a resistance R6n and a fuse F6n. The resistance R6n and the fuse F6n are electrically coupled in series with each other. The first terminal of the resistance R6n is electrically coupled to the word line WL0. The second terminal of the resistance R6n is electrically coupled to the first terminal of the fuse F6n. The second terminal of the fuse F6n is electrically coupled to the row decoder 18.

The resistances R60-R6n of the variable resistance circuit VRCW0 have an equivalent resistance value. The resistances R60-R6n in the variable resistance circuit VRCW1-VRCW3 have resistance values equivalent to the resistances R60-R6n, respectively, of the variable resistance circuit VRCW0.

Effect of Eighth Embodiment

In the eighth embodiment, the variable resistance circuits VRCW0-VRCW3 including the fuses F60-F6n and the resistances R60-R6n are electrically coupled to the ends of the word lines WL0-WL3, respectively. The resistance values of the variable resistance circuits VRCW0-VRCW3 are set so as to make the following total resistance values be equivalent: the total resistance value of the variable resistance circuit VRCW0 and the word line WL0; the total resistance value of the variable resistance circuit VRCW1 and the word line WL1; the total resistance value of the variable resistance circuit VRCW2 and the word line WL2; and the total resistance value of the variable resistance circuit VRCW3 and the word line WL3. Thus, the same effect as the effect achieved with the local bit lines LBL0-LBL3 of the second embodiment can also be obtained with the word lines WL0-WL3.

Ninth Embodiment

A semiconductor storage device according to the ninth embodiment will be described below with reference to FIG. 18. The ninth embodiment is a modification of the third embodiment explained above. In the ninth embodiment, variable resistance circuits VRCW0-VRCW3 including transistor T60-T6n and resistances R60-R6n are electrically coupled to word lines WL0-WL3, respectively. The ninth embodiment may be combined with the third embodiment or the sixth embodiment explained above. The ninth embodiment will be described in detail below.

In the ninth embodiment, the difference from the third embodiment will be mainly described, and similar features will not be explained.

Configuration of Ninth Embodiment

Figure 18:
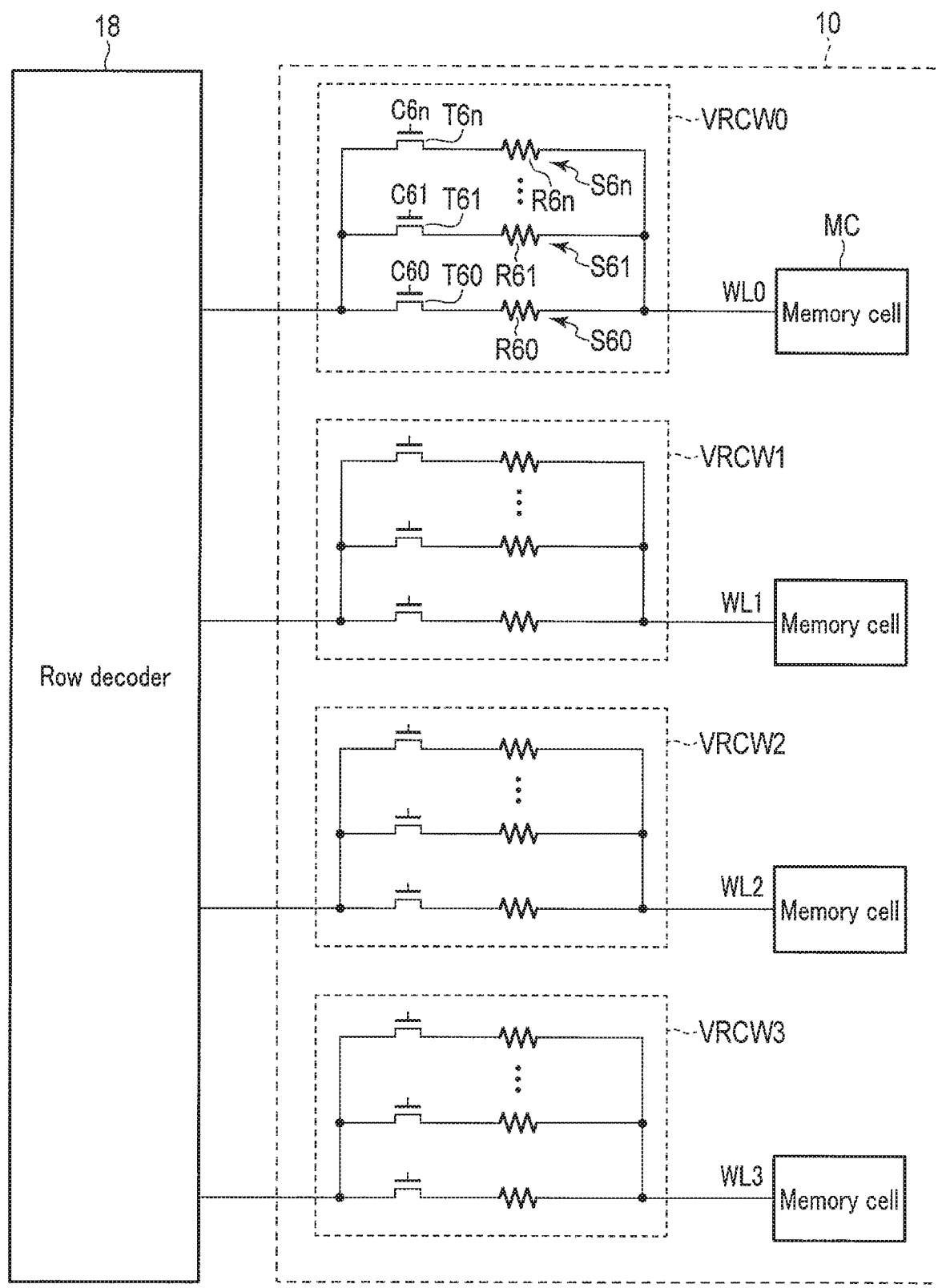
FIG. 18 is a circuit diagram showing variable resistance circuits in the semiconductor storage device according to the ninth embodiment in more detail.

FIG. 18 is a circuit diagram showing the variable resistance circuits VRCW in the semiconductor storage device according to the ninth embodiment in more detail. The configurations of the variable resistance circuits VRCW0-VRCW3 are similar, and therefore, the configuration of the variable resistance circuit VRCW0 will be hereinafter explained.

As shown in FIG. 18, the variable resistance circuit VRCW0 includes series circuits S60-S6n. The series circuit S60 includes a resistance R60 and a transistor T60. The resistance R60 and the transistor T60 are electrically coupled in series with each other. The first terminal of the resistance R60 is electrically coupled to word line WL0. The second terminal of resistance R60 is electrically coupled to the first terminal of transistor T60. The second terminal of the transistor T60 is electrically coupled to the row decoder 18. The control terminal of transistor T60 is electrically coupled to control line C60.

The series circuit S61-S6n has a configuration similar to the series circuit S60.

More specifically, the series circuit S61 includes a resistance R61 and a transistor T61. The resistance R61 and the transistor T61 are electrically coupled in series with each other. The first terminal of resistance R61 is electrically coupled to word line WL0. The second terminal of resistance R61 is electrically coupled to the first terminal of transistor T61. The second terminal of the transistor T61 is electrically coupled to the row decoder 18. The control terminal of the transistor T61 is electrically coupled to the control line C61.

The series circuit S6n includes a resistance R6n and a transistor T6n. The resistance R6n and transistor T6n are electrically coupled in series with each other. The first terminal of resistance R6n is electrically coupled to word line WL0. The second terminal of resistance R6n is electrically coupled to the first terminal of transistor T6n. The second terminal of the transistor T6n is electrically coupled to the row decoder 18. The control terminal of the transistor T6n is electrically coupled to the control line C6n.

The control lines C60-C6n are supplied with a predetermined voltage from a control circuit (not shown), so that the ON/OFF states of the transistors T60-T6n are controlled.

Effect of Ninth Embodiment

In the ninth embodiment, the variable resistance circuits VRCW0-VRCW3 including the transistor T60-T6n and the resistances R60-R6n are electrically coupled to the ends of the word lines WL0-WL3, respectively. The resistance values of the variable resistance circuits VRCW0-VRCW3 are set so as to make the following total resistance values be equivalent: the total resistance value of the variable resistance circuit VRCW0 and the word line WL0; the total resistance value of the variable resistance circuit VRCW1 and the word line WL1; the total resistance value of the variable resistance circuit VRCW2 and the word line WL2; and the total resistance value of the variable resistance circuit VRCW3 and the word line WL3. Thus, the same effect as the effect achieved with the local bit lines LBL0-LBL3 of the third embodiment can also be obtained with the word lines WL0-WL3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor storage device comprising:
 a first memory cell including a first resistance change element;
 a second memory cell including a second resistance change element;
 a first column selection transistor;
 a second column selection transistor;
 a first bit line coupled between a first terminal of the first memory cell and a first terminal of the first column selection transistor, and between a first terminal of the second memory cell and the first terminal of the first column selection transistor;

a first source line coupled between a second terminal of
  the first memory cell and a first terminal of the second
  column selection transistor, and between a second
  terminal of the second memory cell and the first ter-
  minal of the second column selection transistor; and
a first correcting resistance coupled in series between the
  first column selection transistor and the second column
  selection transistor,
wherein the first memory cell and the second memory cell
  are coupled in parallel to the first correcting resistance.
2. The device of claim 1, further comprising:
a third memory cell including a third resistance change
  element;
a fourth memory cell including a fourth resistance change
  element;
a third column selection transistor;
a fourth column selection transistor;
a second bit line coupled between a first terminal of the
  third memory cell and a first terminal of the third
  column selection transistor, and between a first terminal
  of the fourth memory cell and the first terminal of the
  third column selection transistor;
a second source line coupled between a second terminal
  of the third memory cell and a first terminal of the
  fourth column selection transistor, and between a sec-
  ond terminal of the fourth memory cell and the first
  terminal of the fourth column selection transistor; and
a second correcting resistance coupled in series between
  the third column selection transistor and the fourth
  column selection transistor, and having a resistance
  value different from the first correcting resistance,
wherein a second terminal of the first column selection
  transistor is coupled to a second terminal of the third
  column selection transistor, and
wherein a second terminal of the second column selection
  transistor is coupled to a second terminal of the fourth
  column selection transistor.
3. The device of claim 2, wherein:
the first memory cell further includes a first transistor;
the third memory cell further includes a third transistor;
a control terminal of the first transistor and a control
  terminal of the third transistor are coupled to a first
  word line;
the first correcting resistance and the second correcting
  resistance are configured to minimize a variation
  between a first sum of resistance values of the first
  correcting resistance, the first memory cell, the first bit
  line, and the first source line and a second sum of
  resistance values of the second correcting resistance,
  the third memory cell, the second bit line, and the
  second source line.
4. The device of claim 3, further comprising:
a fifth memory cell including a fifth resistance change
  element and a fourth transistor;
a third bit line coupled to a first terminal of the fifth
  memory cell;
a third source line coupled to a second terminal of the fifth
  memory cell; and
a third correcting resistance coupled to one of the third bit
  line and the third source line,
wherein:
the first word line is coupled to a control terminal of the
  fourth transistor,
the first memory cell is disposed between the third
  memory cell and the fifth memory cell along the first
  word line, and
the first correcting resistance has a resistance value
  smaller than the second correcting resistance and the
  third correcting resistance or larger than the second
  correcting resistance and the third correcting resistance.

5. The device of claim 1, wherein the first correcting
resistance is coupled to the first bit line, and is coupled in
series between the first memory cell and a sense amplifier,
and is coupled in series between the second memory cell and
the sense amplifier.
6. The device of claim 1, wherein the first correcting
resistance is coupled to the first source line, is coupled in
series between the first memory cell and a sink, and is
coupled in series between the second memory cell and the
sink.
7. A semiconductor storage device comprising:
a first memory cell including a first resistance change
  element;
a second memory cell including a second resistance
  change element;
a first column selection transistor;
a second column selection transistor;
a first bit line coupled between a first terminal of the first
  memory cell and a first terminal of the first column
  selection transistor, and between a first terminal of the
  second memory cell and the first terminal of the first
  column selection transistor;
a first source line coupled between a second terminal of
  the first memory cell and a first terminal of the second
  column selection transistor, and between a second
  terminal of the second memory cell and the first ter-
  minal of the second column selection transistor; and
a first variable resistance circuit coupled in series between
  the first column selection transistor and the second
  column selection transistor,
wherein the first memory cell and the second memory cell
  are coupled in parallel to the first variable resistance
  circuit.
8. The device of claim 7, wherein:
the first variable resistance circuit includes a first series
  circuit and a second series circuit coupled in parallel,
the first series circuit includes a first correcting resistance
  and a first fuse coupled in series, and
the second series circuit includes a second correcting
  resistance and a second fuse coupled in series.
9. The device of claim 7, wherein:
the first variable resistance circuit includes a first series
  circuit and a second series circuit coupled in parallel,
the first series circuit includes a first correcting resistance
  and a first transistor coupled in series, and
the second series circuit includes a second correcting
  resistance and a second transistor coupled in series.
10. The device of claim 7, wherein the first variable
resistance circuit is coupled to the first bit line, is coupled in
series between the first memory cell and a sense amplifier,
and is coupled in series between the second memory cell and
the sense amplifier.
11. The device of claim 7, wherein the first variable
resistance circuit is coupled to the first source line, is
coupled in series between the first memory cell and a sink,
and is coupled in series between the second memory cell and
the sink.
12. A semiconductor storage device comprising:
a first memory cell including a first resistance change
  element and a first transistor;
a first word line coupled to a control terminal of the first
  transistor; and
a first correcting resistance coupled to the first word line,
wherein the first correcting resistance includes a first
  terminal coupled to the first memory cell and a second
  terminal coupled to a row decoder.
13. The device of claim 12, further comprising:
a second memory cell including a second resistance
  change element and a second transistor;

a second word line coupled to a control terminal of the second transistor; and a second correcting resistance coupled to the second word line and having a resistance value different from the first correcting resistance, wherein the second correcting resistance includes a first terminal coupled to the second memory cell and a second terminal coupled to the row decoder.

* * * * *